(12) United States Patent
Zhang et al.

(10) Patent No.: US 11,854,468 B2
(45) Date of Patent: Dec. 26, 2023

(54) DISPLAY PANEL HAVING NARROW BEZEL AND DISPLAY APPARATUS THEREOF

(71) Applicant: WUHAN TIANMA MICROELECTRONICS CO., LTD., Wuhan (CN)

(72) Inventors: Huanxi Zhang, Wuhan (CN); Caifeng Chen, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 17/751,389

(22) Filed: May 23, 2022

(65) Prior Publication Data

US 2022/0301497 A1 Sep. 22, 2022

(30) Foreign Application Priority Data

Dec. 30, 2021 (CN) .......................... 202111650200.8

(51) Int. Cl.
  *G09G 3/32* (2016.01)
(52) U.S. Cl.
  CPC ....... *G09G 3/32* (2013.01); *G09G 2300/0426* (2013.01); *G09G 2310/0267* (2013.01);
  (Continued)
(58) Field of Classification Search
  CPC ... G09G 3/32–3291; G09G 2300/0408; G09G 2300/0426; G09G 2300/043; G09G 2310/02; G09G 2310/0205; G09G 2310/0243; G09G 2310/0262; G09G 2310/0267; G09G 2310/0286; G09G 2310/06; G09G 2310/08; G09G 2320/0233
  See application file for complete search history.

(56) References Cited

U.S. PATENT DOCUMENTS 11,244,623 B2 *  2/2022  Chen .................... G09G 3/3258
2017/0098413 A1 *  4/2017  Lee ...................... G09G 3/3233
(Continued)

FOREIGN PATENT DOCUMENTS

CN    104157236 A    11/2014
CN    107784977 A    3/2018

*Primary Examiner* — Nathan Danielsen
(74) *Attorney, Agent, or Firm* — CHRISTENSEN O'CONNOR JOHNSON KINDNESS PLLC

(57) ABSTRACT

The present disclosure provide a display panel and a display apparatus. The display panel includes a pixel driving circuit including a light-emitting control signal terminal and a node control signal terminal; the display panel further includes a light-emitting driving circuit, including a plurality of light-emitting driving units, an output terminal of each light-emitting driving unit transmitting a light-emitting control signal to a light-emitting control signal terminal; a gate driving circuit, including a plurality of gate driving units, an output terminal of gate driving unit transmitting a node control signal to the node control signal terminal, where signals inputted to input terminals of the light-emitting driving units and input terminals of the gate driving units are the same; and a common transmission signal line, the input terminals of the light-emitting driving units and the input terminals of the gate driving units are connected to the same common transmission signal line.

19 Claims, 14 Drawing Sheets

(52) U.S. Cl.
CPC ............... *G09G 2310/0286* (2013.01); *G09G 2310/0291* (2013.01)

(56) References Cited

U.S. PATENT DOCUMENTS

| | | | |
|---|---|---|---|
| 2017/0186362 A1* | 6/2017 | Shim | G09G 3/3266 |
| 2021/0150960 A1* | 5/2021 | Kim | G09G 3/3266 |
| 2021/0183312 A1* | 6/2021 | Kim | G09G 3/3266 |
| 2021/0375212 A1* | 12/2021 | Kwon | G09G 3/3266 |

* cited by examiner

DISPLAY PANEL HAVING NARROW BEZEL AND DISPLAY APPARATUS THEREOF

CROSS REFERENCE TO RELATED APPLICATIONS

The present application claims priority to Chinese Patent Application No. CN 202111650200.8, filed on Dec. 30, 2021, the content of which is incorporated herein by reference in its entirety.

TECHNICAL FIELD

The present disclosure relates to the technical field of display, and in particular, to a display panel and a display apparatus.

BACKGROUND

With the development of display technologies, the narrow bezel display is gradually attracting people's attention due to its simplicity and large viewing area.

At present, a display panel usually consists of multiple sub-pixels in a display region and a driving circuit in a non-display region to drive the sub-pixels. The driving circuit generally consists of multiple cascaded shift register units and signal lines electrically connected to the shift register units. The bezel area of the display panel is large because the region in which the driving circuit is located cannot be used for display, resulting in a large bezel area of the display panel, which limits the increase of the screen-to-body ratio of the display panel.

SUMMARY

In view of this, embodiments of the present disclosure provide a display panel and a display apparatus, to reduce the bezel width of the display panel.

According to one aspect, an embodiment of the present disclosure provides a display panel, including a pixel driving circuit, wherein the pixel driving circuit includes a light-emitting control signal terminal and a node control signal terminal;

the display panel further includes:
- a light-emitting driving circuit, including a plurality of light-emitting driving units that are cascaded and arranged along a first direction, an output terminal of each light-emitting driving unit transmitting a light-emitting control signal to the light-emitting control signal terminal;
- a gate driving circuit, including a plurality of gate driving units that are cascaded and arranged along the first direction, an output terminal of each gate driving unit transmitting a node control signal to the node control signal terminal;
- signals inputted to at least part of input terminals of the light-emitting driving units and at least part of input terminals of the gate driving units are the same; and
- a common transmission signal line, at least part of the input terminals of the light-emitting driving units and at least part of the input terminals of the gate driving units being connected to the same common transmission signal line.

According to another aspect, an embodiment of the present disclosure provides a display apparatus, including the foregoing display panel.

BRIEF DESCRIPTION OF THE DRAWINGS

To describe the technical solutions in the embodiments of the present disclosure more clearly, the following briefly describes the accompanying drawings required to be used in the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

For better understanding of the technical solutions of the present disclosure, the embodiments of the present disclosure are described in detail below with reference to the accompanying drawings.

It should be noted that the embodiments in the following descriptions are only a part rather than all of the embodiments in the present disclosure. All other embodiments obtained by those ordinarily skilled in the art based on the embodiments of the present disclosure should also fall within the protection scope of the present disclosure.

Terms in the embodiments of the present disclosure are merely used to describe the specific embodiments, and are not intended to limit the present disclosure. Unless otherwise specified in the context, words, such as "a", "the", and "this", in a singular form in the embodiments of the present disclosure and the appended claims include plural forms.

It should be understood that the term "and/or" in this specification merely describes associations between associated objects, and it indicates three types of relationships. For example, A and/or B may indicate that A exists alone, A and B coexist, or B exists alone. In addition, the character "/" in this specification generally indicates that the associated objects are in an "or" relationship.

Figure 1:
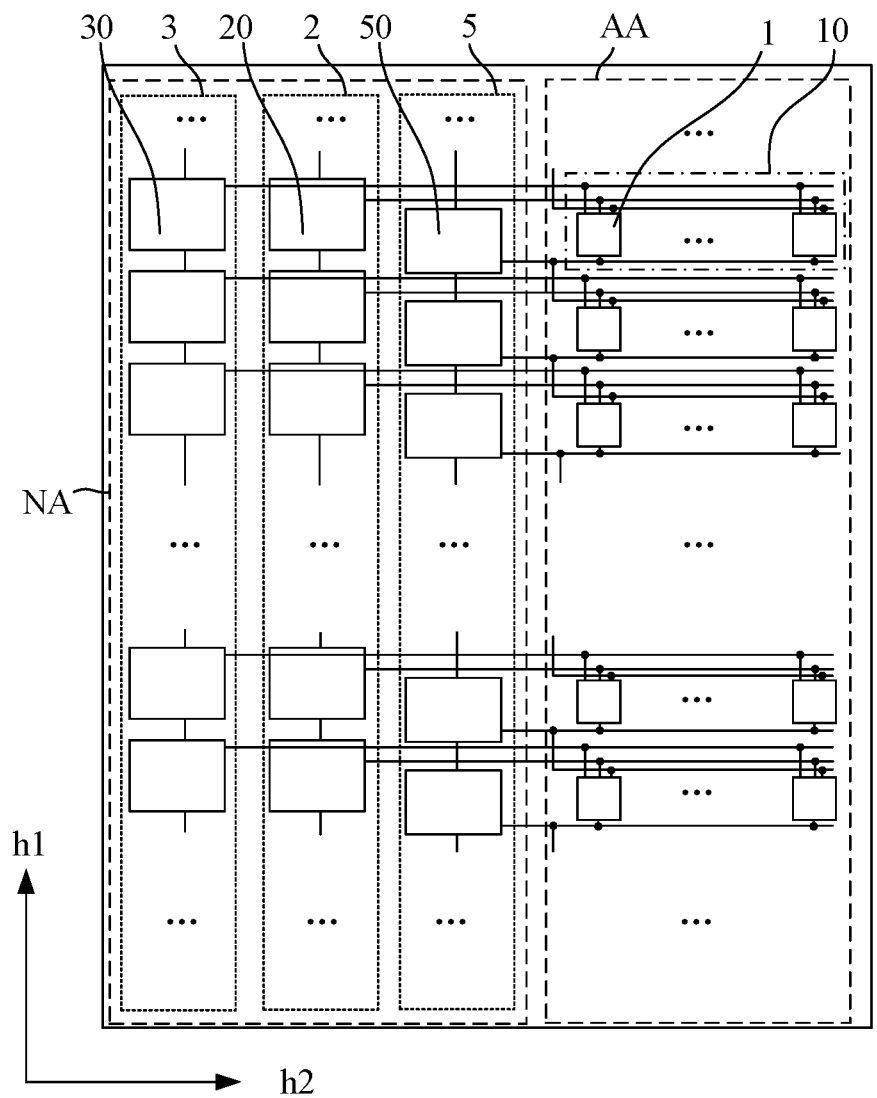
FIG. 1 is a schematic diagram of a display panel according to an embodiment of the present disclosure.
Figure 2:
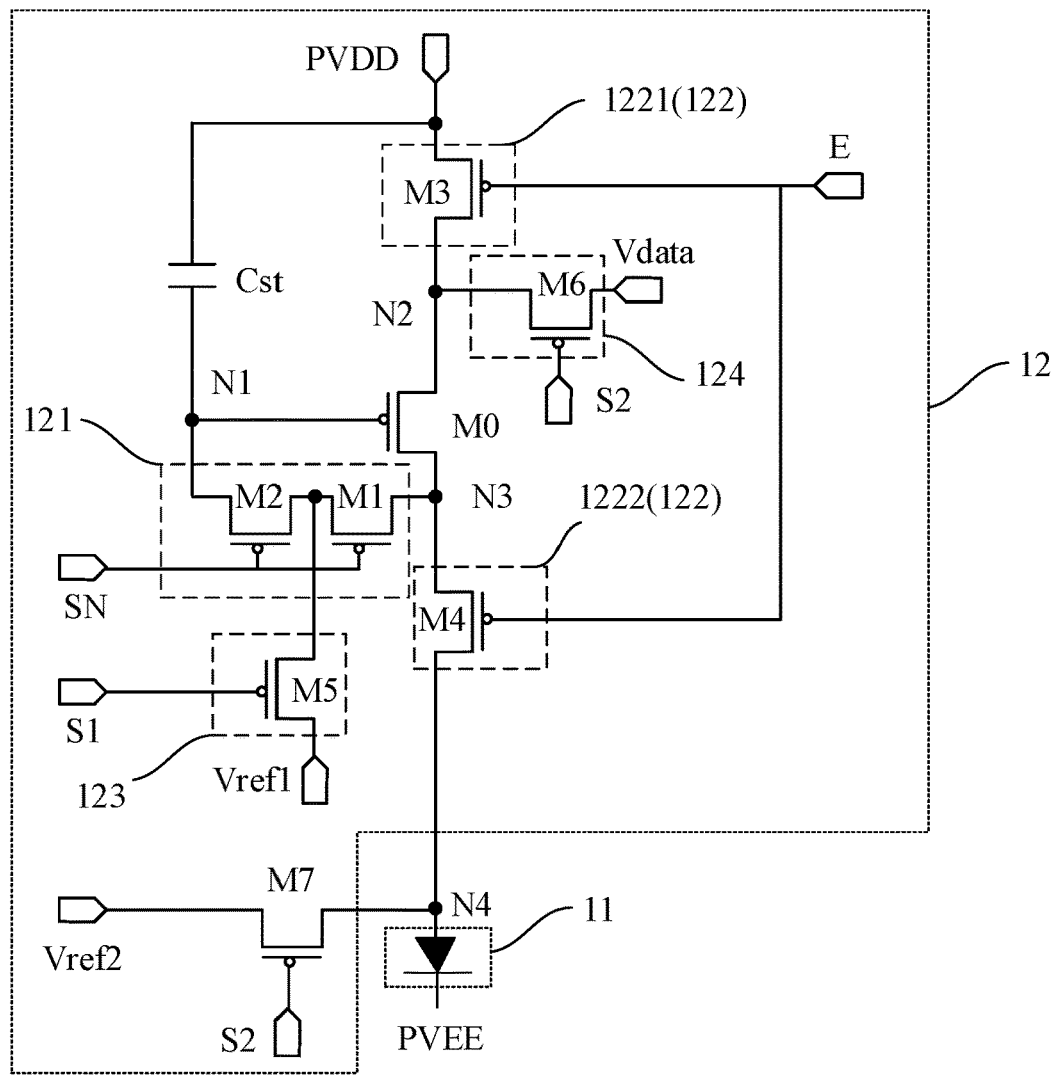
FIG. 2 is an equivalent circuit diagram of a sub-pixel according to an embodiment of the present disclosure.

The embodiments of the present disclosure provide a display panel. FIG. 1 is a schematic diagram of a display panel according to an embodiment of the present disclosure. As shown in FIG. 1, the display panel includes a display region AA and a non-display region NA, and the display region AA includes a plurality of sub-pixels 1. For example, FIG. 2 is an equivalent circuit diagram of a sub-pixel according to an embodiment of the present disclosure. As shown in FIG. 2, the sub-pixel 1 includes a light-emitting unit 11 and a pixel driving circuit 12 that are electrically connected to each other.

For example, as shown in FIG. 2, the pixel driving circuit 12 includes a drive transistor M0, a node control module 121, a light-emitting control module 122, a first node reset module 123, and a data writing module 124. A gate of the drive transistor M0 is electrically connected to a first node N1, a first electrode of the drive transistor M0 is electrically connected to a second node N2, and a second electrode of the drive transistor M0 is electrically connected to a third node N3. One terminal of the node control module 121 is electrically connected to the first node N1, and the other terminal of the node control module 121 is electrically connected to the third node N3. As shown in FIG. 2, the light-emitting control module 122 includes a first sub-light-emitting control module 1221 and a second sub-light-emitting control module 1222. A first terminal of the first sub-light-emitting control module 1221 is electrically connected to a power voltage terminal PVDD and a second terminal of the first sub-light-emitting control module 1221 is electrically connected to the second node N2. A first terminal of the second sub-light-emitting control module 1222 is electrically connected to the third node N3 and a second terminal is electrically connected to the light-emitting unit 11. A first terminal of the first node reset module 123 is electrically connected to a first reset signal terminal Vref1, and a second terminal is electrically connected to the first node N1. A first terminal of the data writing module 124 is electrically connected to a data signal terminal Vdata, and a second terminal of the data writing module 124 is electrically connected to the second node N2.

The pixel driving circuit 12 further includes a light-emitting control signal terminal E, a node control signal terminal SN, a first scanning signal terminal S1, and a second scanning signal terminal S2. In response to a node control signal provided by the node control signal terminal SN, the node control module 121 electrically connects the third node N3 to the first node N1, to control the first node N1, that is, the potential of the gate of the drive transistor M0. In response to a light-emitting control signal provided by the light-emitting control signal terminal E, the first sub-light-emitting control module 1221 and the second sub-light-emitting control module 1222 control a driving current to flow through the light-emitting unit 11. In response to a first scanning signal provided by the first scanning signal terminal S1, the first node reset module 123 electrically connects the first reset signal terminal Vref1 to the first node N1. In response to a second scanning signal provided by the second scanning signal terminal S2, the data writing module 124 electrically connects the data signal terminal Vdata to the second node N2.

For example, as shown in FIG. 2, the node control module 121 includes a first transistor M1 and a second transistor M2; a first electrode of the first transistor M1 is electrically connected to the third node N3, and a second electrode of the first transistor M1 is electrically connected to a first electrode of the second transistor M2; a second electrode of the second transistor M2 is electrically connected to the gate of the drive transistor M0; a gate of the first transistor M1 and a gate of the second transistor M2 are both electrically connected to the node control signal terminal SN.

In an embodiment, as shown in FIG. 2, the first sub-light-emitting control module 1221 includes a third transistor M3; the second sub-light-emitting control module 1222 includes a fourth transistor M4. A first electrode of the third transistor M3 is electrically connected to the power signal terminal PVDD, and a second electrode of the third transistor M3 is electrically connected to the first electrode of the drive transistor M0, that is, the second node N2. A first electrode of the fourth transistor M4 is electrically connected to the second electrode of the drive transistor M0, that is, the third node N3, and a second electrode of the fourth transistor M4 is electrically connected to the first electrode of the light-emitting unit 11. A gate of the third transistor M3 and a gate of the fourth transistor M4 are both electrically connected to the light-emitting control signal terminal E. The second electrode of the light-emitting unit 11 is electrically connected to the power signal terminal PVEE.

The first node reset module 123 includes a fifth transistor M5. A gate of the fifth transistor M5 is electrically connected to the first scanning signal terminal S1, a first electrode of the fifth transistor M5 is electrically connected to the first reset signal terminal Vref1, and a second electrode of the fifth transistor M5 is electrically connected to the first electrode of the second transistor M2. The data writing module 124 includes a sixth transistor M6. A gate of the sixth transistor M6 is electrically connected to the second scanning signal terminal S2, a first electrode of the sixth transistor M6 is electrically connected to the data signal terminal Vdata, and a second electrode of the sixth transistor M6 is electrically connected to the second node N2.

For example, as shown in FIG. 2, the pixel driving circuit 12 further includes a light-emitting unit reset transistor M7 and a storage capacitor Cst. A gate of the light-emitting unit reset transistor M7 is electrically connected to the second scanning signal terminal S2, a first electrode of the light-emitting unit reset transistor M7 is electrically connected to the second reset signal terminal Vref2, and a second electrode of the light-emitting unit reset transistor M7 is electrically connected to the light-emitting unit 11. A first electrode plate of the storage capacitor Cst is electrically connected to the power signal terminal PVDD, and a second electrode plate of the storage capacitor Cst is electrically connected to the first node N1.

Figure 3:
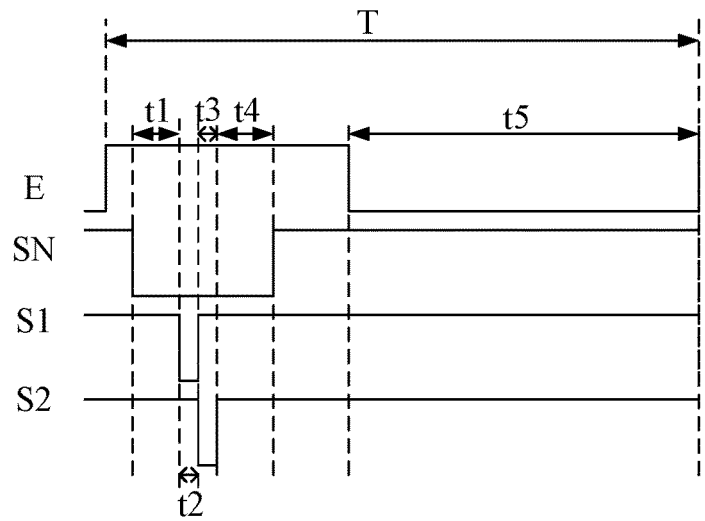
FIG. 3 is a working sequence diagram of the pixel driving circuit shown in FIG. 2.

In an embodiment, FIG. 3 is a working sequence diagram of the pixel driving circuit shown in FIG. 2. As shown in FIG. 3, when the pixel driving circuit 12 works, the following happens in one working cycle T:

In a first period t1, the node control signal terminal SN transmits an active level signal, and both the first transistor M1 and the second transistor M2 are turned on, to ensure effective charging for the first node N1 subsequently, reducing the impact of a delayed data signal.

In a second period t2, both the node control signal terminal SN and the first scanning signal terminal S1 transmit an active level signal; the first transistor M1, the second transistor M2, and the fifth transistor M5 are all turned on; the first node N1 is reset by using the first reset signal terminal Vref1.

In a third period t3, both the node control signal terminal SN and the second scanning signal terminal S2 transmit an active level signal; the first transistor M1, the second transistor M2, the sixth transistor M6, the light-emitting unit reset transistor M7, and the drive transistor M0 are all turned on. The data signal provided by the data signal terminal Vdata charges the first node N1 through the sixth transistor M6, the drive transistor M0, the first transistor M1, and the second transistor M2, until the potential of the first node N1 becomes Vdata−|Vth| to complete threshold capture. Vth is a threshold voltage of the drive transistor M0. A second reset signal provided by the second reset signal terminal Vref2 is written into the light-emitting unit 11 through the light-emitting unit reset transistor M7.

In a fourth period t4, the node control signal terminal SN continues to transmit the active level signal, and both the first transistor M1 and the second transistor M2 are turned on, to make sure that the threshold can still be captured normally when the second scanning signal provided by the second scanning signal terminal S2 is delayed.

In a fifth period t5, the light-emitting control signal terminal E transmits an active level signal; the third transistor M3, the fourth transistor M4, and the drive transistor M0 are turned on, and a light-emitting current flows through the light-emitting unit 11, to cause the light-emitting unit 11 to emit light.

In the embodiments of the present disclosure, the light-emitting driving signal E and the node control signal SN can be implemented in different ways depending on different design requirements of the display panel.

For example, to meet the user's display requirements for different application scenarios of the display product, the display panel may work in a low-frequency display mode and a high-frequency display mode. When a dynamic picture is displayed, the display panel may work in the high-frequency display mode with a refresh frequency equal to or higher than 60 Hz, to improve the display effect of the display panel. FIG. 3 is a schematic sequence diagram when the refresh frequency of the display panel is 60 Hz, wherein the light-emitting driving signal E and the node control signal SN are both pulse signals, and a pulse width of the light-emitting driving signal E is larger than a pulse width of the node control signal SN.

When a static picture is displayed, the display panel may work in the low-frequency display mode with a refresh frequency of 15 Hz or 30 Hz, to reduce the power consumption of the display panel. In the low-frequency display mode, in one driving cycle of the pixel driving circuit, a working process of the pixel driving circuit includes a writing sub-phase and a holding sub-phase. In the writing sub-phase, the pixel driving circuit 12 sequentially executes the first period t1, the second period t2, the third period t3, the fourth period t4, and the fifth period t5 as shown in FIG. 3. In the holding sub-phase, the data signal is no longer provided to the pixel driving circuit 12. That is, there is no data writing process in the holding sub-phase, and the potential of the first node N1 is maintained to cause the light-emitting unit 11 to emit light continuously.

For example, one or more holding sub-phases may be set in one driving cycle of the pixel driving circuit. In the holding sub-phase, the signal sequence of the light-emitting control signal terminal E may be controlled to be the same as that in the writing sub-phase, so that the corresponding light-emitting unit 11 can emit light continuously. In the embodiments of the present disclosure, the time length of the holding sub-phase may be equal to the time length of the writing sub-phase. Alternatively, in the embodiments of the present disclosure, the writing sub-phase may be divided into a plurality of equal parts, and the time length of the holding sub-phase is equal to an integer multiple of one equal part.

Figure 4:
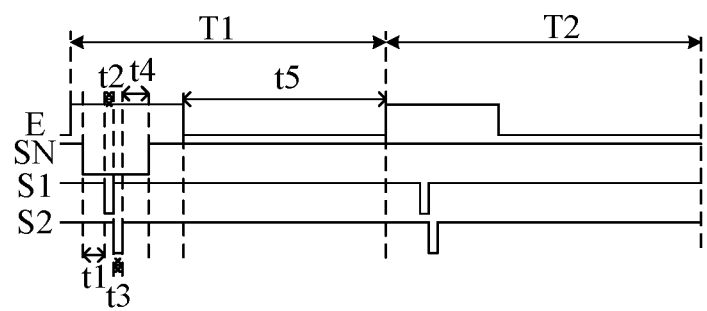
FIG. 4 is another working sequence diagram of the pixel driving circuit shown in FIG. 2.

FIG. 4 is another working sequence diagram of the pixel driving circuit shown in FIG. 2. As shown in FIG. 4, the refresh frequency of the pixel driving circuit may be 15 Hz, and in one driving cycle of the pixel driving circuit, a working process of the pixel driving circuit includes a writing sub-phase T1 and a holding sub-phase T2.

In the writing sub-phase T1, in the embodiments of the present disclosure, signals of the light-emitting control signal terminal E, the node control signal terminal SN, the first scanning signal terminal S1, and the second scanning signal terminal S2 may work according to the sequence shown in FIG. 3.

In the holding sub-phase T2, for example, as shown in FIG. 4, in the embodiments of the present disclosure, the signal sequence of the light-emitting control signal terminal E, the first scanning signal terminal S1, and the second scanning signal terminal S2 may be the same as the sequence in the writing sub-phase T1, so that the node control signal terminal SN transmits a signal that causes the first transistor M1 and the second transistor M2 to turn off. As shown in FIG. 4, the frequency of the light-emitting driving signal E is higher than the frequency of the node control signal SN.

In the low-frequency driving display, the potential of the first node N1 needs to be maintained for a relatively long time. Therefore, in the related art, in the low-frequency mode, the first node N1 has a current leakage problem, causing the brightness of the light-emitting unit 12 to change, thus resulting in flickering. By using the method of the embodiments of the present disclosure, the first reset signal terminal Vref1 is electrically connected to the first node N1 through the fifth transistor M5 and the second transistor M2, and the leakage current flowing from the first reset signal terminal Vref1 to the first node N1 when the fifth transistor M5 and the second transistor M2 are turned off can be effectively reduced. Moreover, in the holding sub-phase, in the embodiments of the present disclosure, the node control signal terminal SN transmits the signal that causes the first transistor M1 and the second transistor M2 to turn off. By controlling the second transistor M2 electrically connected to the first node N1 to be turned off, the leakage current flowing to the first node N1 can also be reduced, thereby alleviating the flickering problem in low-frequency display and improving the low-frequency display effect.

For example, the drive transistor M0, the first transistor M1, the second transistor M2, the third transistor M3, the fourth transistor M4, the fifth transistor M5, the sixth transistor M6, and the light-emitting unit reset transistor M7 may be prepared by using a low-temperature polysilicon process, to reduce the number of mask plates required for the process, simplify the manufacturing process, and reducing the process cost.

Figure 5:
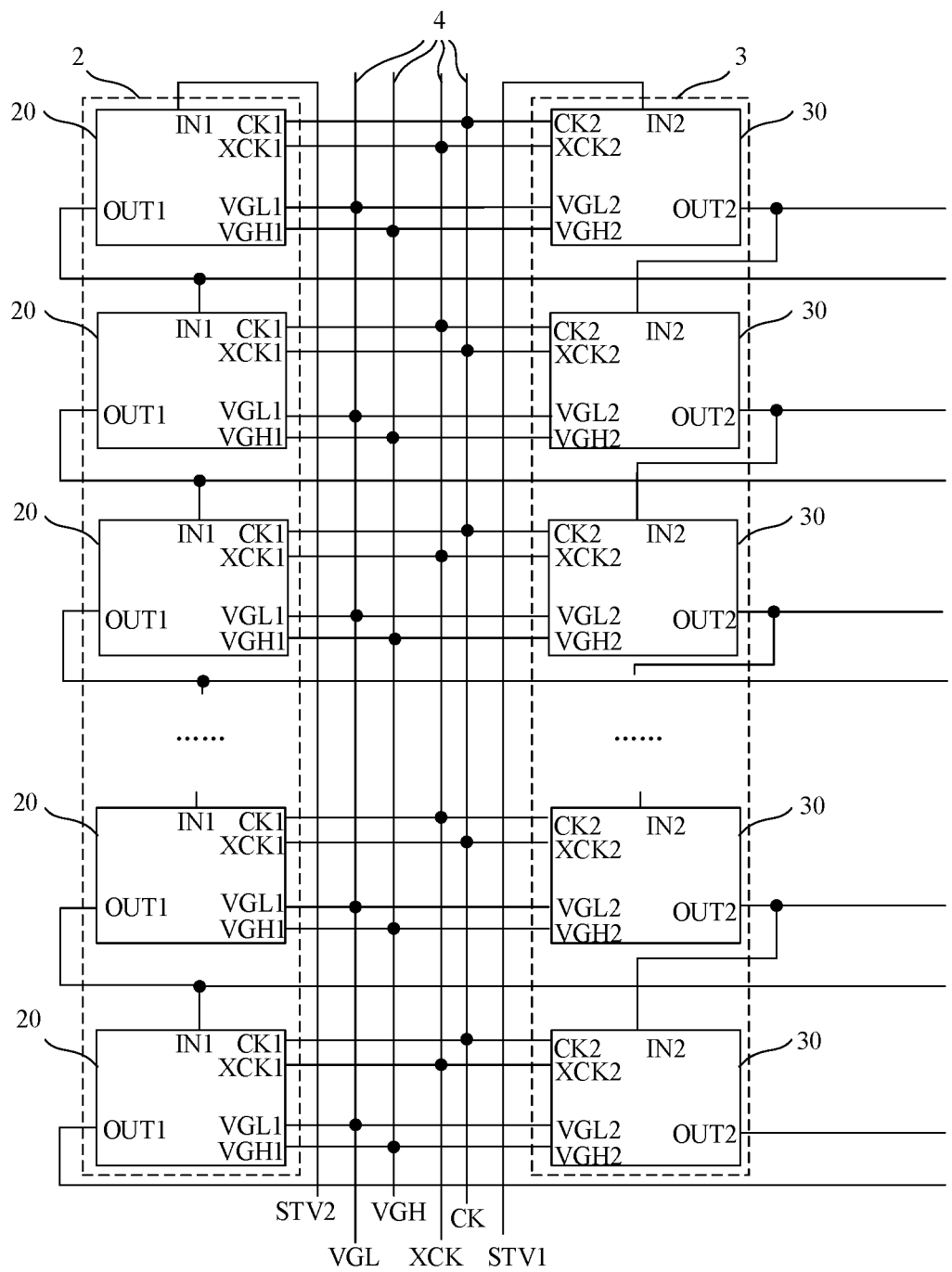
FIG. 5 is a schematic diagram of circuit connection between a light-emitting driving circuit and a gate driving circuit according to an embodiment of the present disclosure.

For example, the non-display region NA of the display panel includes a light-emitting driving circuit and a gate driving circuit. The light-emitting driving circuit is configured to provide a light-emitting driving signal to the light-emitting control signal terminal E of the pixel driving circuit 12. The gate driving circuit is configured to provide a node control signal to the node control signal terminal SN of the pixel driving circuit 12. As shown in FIG. 1 and FIG. 5, FIG. 5 is a schematic diagram of circuit connection between a light-emitting driving circuit and a gate driving circuit according to an embodiment of the present disclosure; the light-emitting driving circuit 2 includes a plurality of cascaded light-emitting driving units 20. In the embodiments of the present disclosure, each light-emitting driving unit 20 includes an output terminal OUT1 and a plurality of input terminals. The output terminal OUT1 of the light-emitting driving unit 20 in each stage of the light-emitting driving circuit 2 is electrically connected to the light-emitting control signal terminal E of the corresponding pixel driving circuit 11. For example, as shown in FIG. 5, the input terminals of the light-emitting driving unit 20 include a first voltage signal terminal VGH1, a second voltage signal terminal VGL2, a first clock signal terminal CK1, a second clock signal terminal XCK1, and a shift signal input terminal IN1. In the embodiments of the present disclosure, the cascaded light-emitting driving units 20 represent that the output terminal OUT1 of the light-emitting driving unit 20 in an upper stage is electrically connected to the shift signal input terminal IN1 of the light-emitting driving unit 20 in a lower stage. Multiple stages of the light-emitting driving units 20 in the light-emitting driving circuit 2 can sequentially output light-emitting driving signals.

In the embodiments of the present disclosure, the circuit structure of the light-emitting driving unit 20 and signals to be received by the input terminals of the light-emitting driving unit 20 can be designed according to the light-emitting driving signal required by the pixel driving circuit 12.

Figure 6:
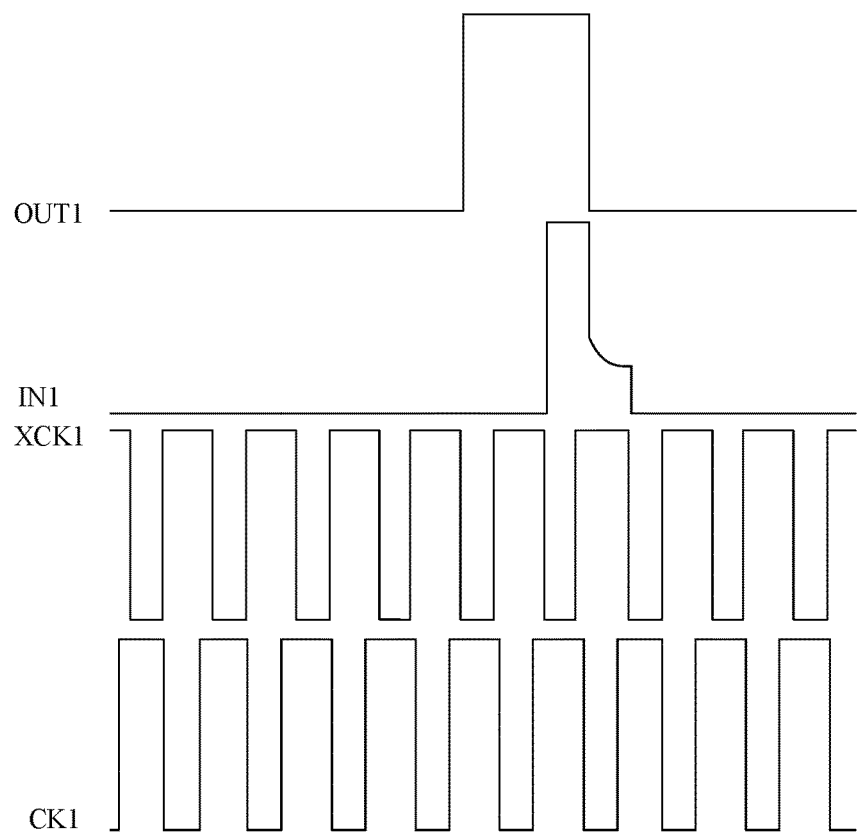
FIG. 6 is a working sequence diagram of a light-emitting driving unit according to an embodiment of the present disclosure.

For example, in the embodiments of the present disclosure, the signal of the first level signal terminal VGH1 and the signal of the second level signal terminal VGL1 are constant signals, and the potential of the first level signal terminal VGH1 is greater than the potential of the second level signal terminal VGL1. The signal of the first clock signal terminal CK1 and the signal of the second clock signal terminal XCK1 are pulse signals, and when one of the first clock signal terminal CK1 and the second clock signal terminal XCK1 transmits an active level signal, the other transmits an inactive level signal. The active level refers to a signal capable of turning on the corresponding transistor, and the inactive level refers to a signal capable of turning off the corresponding transistor. FIG. 6 is a working sequence diagram of a light-emitting driving unit according to an embodiment of the present disclosure. It can be seen from FIG. 6 that, under the effect of signals of multiple input terminals including the first clock signal terminal CK1 and the second clock signal terminal XCK1, the light-emitting driving unit can shift the signal of the shift signal input terminal IN1 and then output the shifted signal through the output terminal OUT1.

Further referring to FIG. 5, the gate driving circuit 3 includes a plurality of cascaded gate driving units 30. In the embodiments of the present disclosure, each gate driving unit 30 includes an output terminal OUT2 and a plurality of input terminals. The output terminal OUT2 of the gate driving unit 30 in each stage of the gate driving circuit 3 is electrically connected to the node control signal terminal SN of the corresponding pixel driving circuit 11. For example, as shown in FIG. 5, the input terminals of the gate driving unit 30 include a first voltage signal terminal VGH2, a second voltage signal terminal VGL2, a first clock signal terminal CK2, a second clock signal terminal XCK2, and a shift signal input terminal IN2. In the embodiments of the present disclosure, the cascaded gate driving units 30 represent that the output terminal OUT2 of the gate driving unit 30 in an upper stage is electrically connected to the shift signal input terminal IN2 of the gate driving unit 30 in a lower stage. Multiple stages of the gate driving units 30 in the gate driving circuit 3 can sequentially output node control signals.

In the embodiments of the present disclosure, the circuit structure of the gate driving unit 30 and signals to be received by the input terminals of the gate driving unit 30 can be designed according to the node control signal required by the pixel driving circuit 12.

Figure 7:
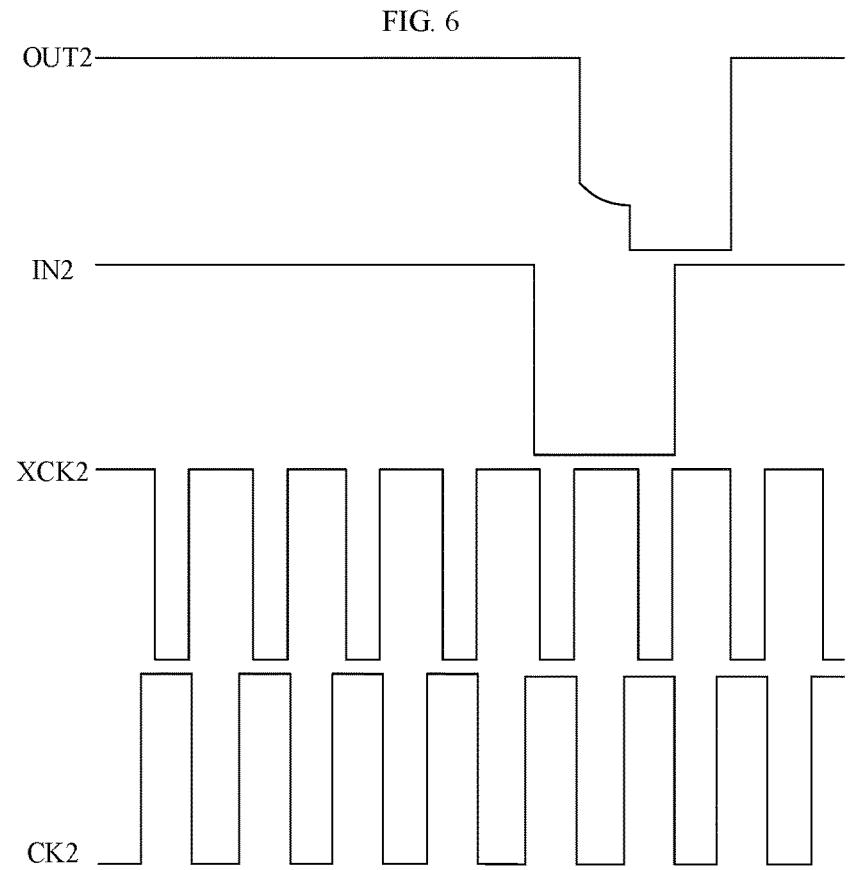
FIG. 7 is a working sequence diagram of a gate driving unit according to an embodiment of the present disclosure.

For example, in the embodiments of the present disclosure, the signal of the first level signal terminal VGH2 and the signal of the second level signal terminal VGL2 are constant signals, and the potential of the first level signal terminal VGH2 is greater than the potential of the second level signal terminal VGL2. The signals of the first clock signal terminal CK2 and the second clock signal terminal XCK2 are pulse signals, and when one of the first clock signal terminal CK2 and the second clock signal terminal XCK2 transmits an active level signal, the other transmits an inactive level signal. The active level refers to a signal capable of turning on the corresponding transistor, and the inactive level refers to a signal capable of turning off the corresponding transistor. FIG. 7 is a working sequence diagram of a gate driving unit according to an embodiment of the present disclosure. It can be seen from FIG. 7 that, under the effect of signals of multiple input terminals including the first clock signal terminal CK2 and the second clock signal terminal XCK2, the gate driving unit can shift the signal of the shift signal input terminal IN2 and then output the shifted signal through the output terminal OUT2.

In the embodiments of the present disclosure, signal inputs to at least part of the input terminals of the light-emitting driving unit 20 and at least part of the input terminals of the gate driving unit 30 are the same.

For example, as shown in FIG. 5, in the embodiments of the present disclosure, the signal input to the first voltage signal terminal VGH1 of the light-emitting driving unit 20 is the same as the signal input to the first voltage signal terminal VGH2 of the gate driving unit 30, and/or the signal input to the second voltage signal terminal VGL1 of the light-emitting driving unit 20 is the same as the signal inputs to the second voltage signal terminal VGL2 of the gate driving unit 30. It can be seen from FIG. 6 and FIG. 7 that in the embodiments of the present disclosure, alternatively, the signal input to the first clock signal terminal CK1 of the light-emitting driving unit 20 is the same as the signal input to the first clock signal terminal CK2 of the gate driving unit 30, and/or, the signal input to the second clock signal terminal XCK1 of the light-emitting driving unit 20 is the same as the signal inputted to the second clock signal terminal XCK2 of the gate driving unit 30.

In the embodiments of the present disclosure, the non-display region NA further includes at least one common transmission signal line. At least part of the input terminals of each light-emitting driving unit 20 and least some of the input terminals of each gate driving unit 30 are connected to the same common transmission signal line.

In the embodiments of the present disclosure, the common transmission signal line includes any one or more of a first voltage signal line VGH, a second voltage signal line VGL, a first clock signal line CK, and a second clock signal line XCK. FIG. 5 is a schematic diagram showing that four common transmission signal lines 4 are arranged in the display panel, wherein the four common transmission signal lines 4 are a first voltage signal line VGH, a second voltage signal line VGL, a first clock signal line CK, and a second clock signal line XCK. The first voltage signal line VGH is electrically connected to the first voltage signal terminal VGH1 of the light-emitting driving unit 20 and the first voltage signal terminal VGH2 of the gate driving unit 30. The second voltage signal line VGL is electrically connected to the second voltage signal terminal VGL1 of the light-emitting driving unit 20 and the second voltage signal terminal VGL2 of the gate driving unit 30. As shown in FIG. 5, the first clock signal terminal CK1 of the light-emitting driving unit 20 in the odd-number stage is electrically connected to the first clock signal line CK, and the second clock signal terminal XCK1 of the light-emitting driving unit 20 in the odd-number stage is electrically connected to the second clock signal line XCK. The first clock signal terminal CK1 of the light-emitting driving unit 20 in the even-number stage is electrically connected to the second clock signal line XCK, and the second clock signal terminal XCK1 of the light-emitting driving unit 20 in the even-number stage is electrically connected to the first clock signal line CK. The first clock signal terminal CK2 of the gate driving unit 30 in the odd-number stage is electrically connected to the first clock signal line CK, and the second clock signal terminal XCK2 of the gate driving unit 30 in the odd-number stage is electrically connected to the second clock signal line XCK. The first clock signal terminal CK2 of the gate driving unit 30 in the even-number stage is electrically connected to the second clock signal line XCK, and the second clock signal terminal XCK2 of the gate driving unit 30 in the even-number stage is electrically connected to the first clock signal line CK.

As shown in FIG. 5, the display panel further includes a frame start light-emitting driving signal line STV1 and a frame start gate driving signal line STV2. The shift signal input terminal IN1 of the $1^{st}$ light-emitting driving unit 20 of the light-emitting driving units 20 that is cascaded is electrically connected to the frame start light-emitting driving signal line STV1. The shift signal input terminal IN2 of the $1^{st}$ gate driving unit 30 of the gate driving units 30 that is cascaded is electrically connected to the frame start gate driving signal line STV2.

In the display panel provided by the embodiments of the present disclosure, the common transmission signal lines 4 are arranged in the non-display region NA, and at least part of the input terminals of each light-emitting driving unit 20 and at least part of the input terminals of each gate driving unit 30 are connected to the same common transmission signal line 4, to ensure normal output of the light-emitting driving unit 20 and the gate driving unit 30, without the need to arrange two signal lines to be electrically connected to the light-emitting driving unit 20 and the gate driving unit 30 respectively, which helps reduce the width of the non-display region NA.

For example, as shown in FIG. 1, the display region AA includes a plurality of sub-pixel rows 10 arranged along a first direction h1, and each sub-pixel row 10 includes a plurality of sub-pixels 1 arranged along a second direction h2. The second direction h2 intersects the first direction h1. In the embodiments of the present disclosure, the light-emitting driving unit 20 in one stage and/or the gate driving unit 30 in one stage may be electrically connected to one sub-pixel row 10; alternatively, in the embodiments of the present disclosure, the light-emitting driving unit 20 in one stage and/or the gate driving unit 30 in one stage may be electrically connected to two sub-pixel rows 10, which is not limited in the embodiments of the present disclosure.

It should be noted that, the quantities and positions of the light-emitting driving circuits 2 and the gate driving circuits 3 shown in FIG. 1 are merely examples. In the actual design of the display panel, along the second direction h2, the embodiments of the present disclosure may arrange the light-emitting driving circuit 2 and/or the gate driving circuit 3 on the left side of the display region AA, or arrange the light-emitting driving circuit 2 and/or the gate driving circuit 3 on the right side of the display region AA; alternatively, the light-emitting driving circuit 2 and/or the gate driving circuit 3 may be configured to provide dual-side driving, that is, the left and right sides of the display region AA are each provided with a set of light-emitting driving circuit 2 and/or the gate driving circuit 3, so as to drive the display region AA from both sides, which is not limited in the embodiments of the present disclosure.

In addition, it should be further noted that, the sequence of the node control signal and the light-emitting driving signal shown in FIG. 3 and FIG. 4, the working sequence of the light-emitting driving unit shown in FIG. 6, and the working sequence of the gate driving unit shown in FIG. 7 are merely examples. In the embodiments of the present disclosure, the sequence of the node control signal and the light-emitting driving signal, the working sequence of the light-emitting driving unit, and the working sequence of the gate driving unit may be designed in other manners, which are not limited in the embodiments of the present disclosure.

Figure 8:
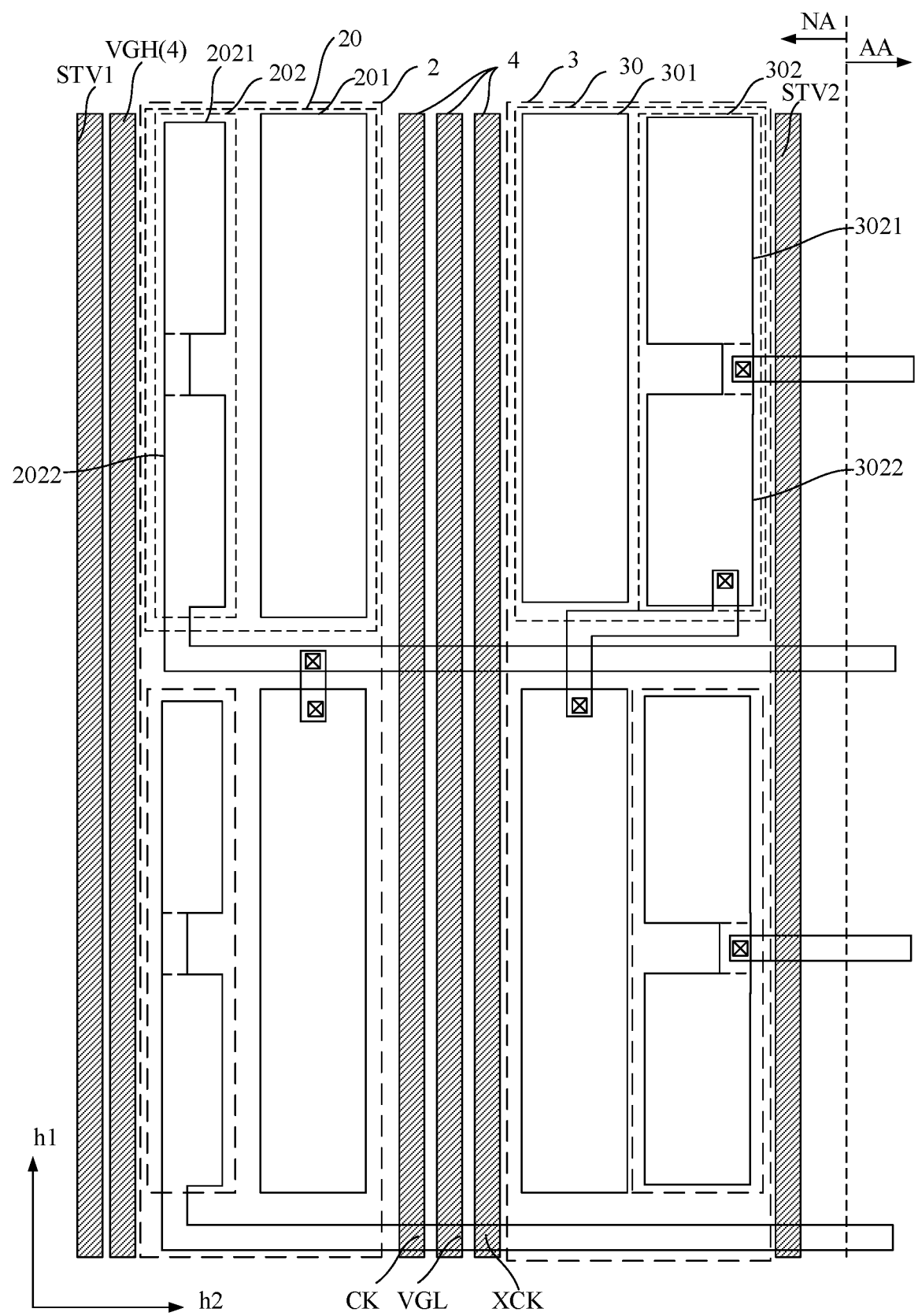
FIG. 8 is a schematic diagram of a simplified layout of light-emitting driving units and gate driving units according to an embodiment of the present disclosure.

For example, during arrangement of the light-emitting driving units 20 and the gate driving units 30, FIG. 8 is a schematic diagram of a simplified layout of light-emitting driving units and gate driving units according to an embodiment of the present disclosure; as shown in FIG. 8, two light-emitting driving units 20 and two gate driving units 30 are taken as an example. In the embodiments of the present disclosure, the cascaded light-emitting driving units 20 may be arranged along the first direction h1, and the cascaded gate driving units 30 may be arranged along the first direction h1.

For example, during arrangement of the common transmission signal line 4, as shown in FIG. 8, in the embodiments of the present disclosure, the common transmission signal line 4 may extend along the first direction h1 to reduce the distance from the common transmission signal line 4 to the light-emitting driving unit 20 in each stage of the light-emitting driving circuit 2, and to reduce the distance from the common transmission signal line 4 to the gate driving unit 30 in each stage of the gate driving circuit 3, so that the common transmission signal line 4 is electrically connected to the light-emitting driving unit 20 and the gate driving unit 30.

For example, when a plurality of common transmission signal lines 4 are arranged, in the embodiments of the present disclosure, the common transmission signal lines 4 may be arranged along the second direction h2.

Figure 9:
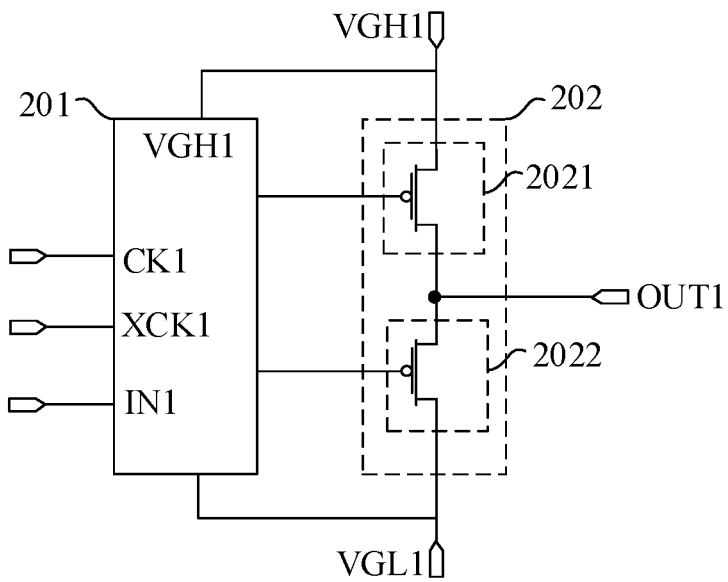
FIG. 9 is a schematic circuit diagram of a light-emitting driving unit according to an embodiment of the present disclosure.

In an embodiment, FIG. 9 is a schematic circuit diagram of a light-emitting driving unit according to an embodiment of the present disclosure; as shown in FIG. 9, the light-emitting driving unit 20 includes a control module 201 and an output module 202 electrically connected to each other. The control module 201 of the light-emitting driving unit 20 is configured to provide a control signal for the output module 202 of the light-emitting driving unit 20. Under the control of the control signal, the output module 202 of the light-emitting driving unit 20 outputs a light-emitting driving signal. A control signal output terminal of the control module 201 of the light-emitting driving unit 20 is electrically connected to the output module 202 of the light-emitting driving unit 20, and the output module 202 of the light-emitting driving unit 20 is electrically connected to the output terminal OUT1 of the light-emitting driving unit 20.

For example, as shown in FIG. 9, the control module 201 of the light-emitting driving unit 20 includes a first voltage signal terminal VGH1, a second voltage signal terminal VGL1, a first clock signal terminal CK1, a second clock signal terminal XCK1, and a shift signal input terminal IN1. The output module 202 of the light-emitting driving unit 20 also includes the foregoing first voltage signal terminal VGH1 and second voltage signal terminal VGL1.

Figure 10:
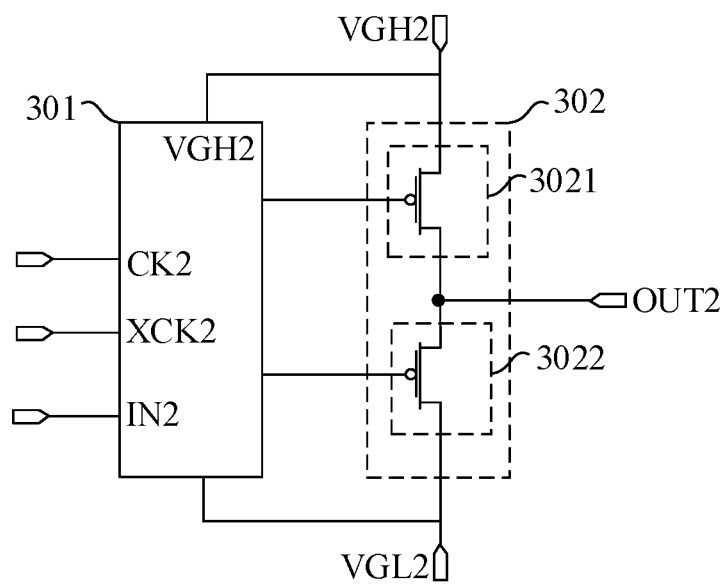
FIG. 10 is a schematic circuit diagram of a gate driving unit according to an embodiment of the present disclosure.

In an embodiment, FIG. 10 is a schematic circuit diagram of a gate driving circuit according to an embodiment of the present disclosure; as shown in FIG. 10, the gate driving unit 30 includes a control module 301 and an output module 302 electrically connected to each other. The control module 301 of the gate driving unit 30 is configured to provide a control signal to the output module 302 of the gate driving unit 30. Under the control of the control signal, the output module 302 of the gate driving unit 30 outputs a node control signal. A control signal output terminal of the control module 301 of the gate driving unit 30 is electrically connected to the output module 302 of the gate driving unit 30, and the output module 302 of the gate driving unit 30 is electrically connected to the output terminal OUT2 of the gate driving unit 30.

For example, as shown in FIG. 10, the control module 301 of the gate driving unit 30 includes a first voltage signal terminal VGH2, a second voltage signal terminal VGL2, a first clock signal terminal CK2, a second clock signal terminal XCK2, and a shift signal input terminal IN2. The output module 302 of the gate driving unit 30 also includes the foregoing first voltage signal terminal VGH2 and second voltage signal terminal VGL2.

In an embodiment, as shown in FIG. 8, in the embodiments of the present disclosure, the output module 202 of the light-emitting driving unit 20 and the control module 201 of the light-emitting driving unit 20 may be arranged along the second direction h2, to reduce the length of the light-emitting driving unit 20 in the first direction h1.

For example, as shown in FIG. 8, in the embodiments of the present disclosure, the output module 302 of the gate driving unit 30 and the control module 301 of the gate driving unit 30 may be arranged along the second direction h2, to reduce the length of the gate driving unit 30 in the first direction h1.

In the embodiments of the present disclosure, the output module 202 of the light-emitting driving unit 20 is located on a side of the control module 201 of the light-emitting driving unit 20 which is away from at least part of the common transmission signal lines 4. As shown in FIG. 8, in the embodiments of the present disclosure, the common transmission signal lines 4 include a first voltage signal line VGH, a second voltage signal line VGL, a first clock signal line CK, and a second clock signal line XCK; the output module 202 of the light-emitting driving unit 20 is located on a side of the control module 201 of the light-emitting driving unit 20 which is away from the first clock signal line CK and the second clock signal line XCK. As shown in FIG. 9, the control module 201 includes a first clock signal terminal CK and a second clock signal terminal XCK. In the embodiments of the present disclosure, the first clock signal line CK and the second clock signal line XCK are arranged close to the control module 201. As shown in FIG. 8, during configuration of the connection line (not shown) between the control module 201 and the first clock signal line CK and configuration of the connection line (not shown) between the control module 201 and the second clock signal line XCK, the length of the connection line can be reduced, which helps reduce the layout complexity of the display panel.

Similarly, as shown in FIG. 8, in the embodiments of the present disclosure, the output module 302 of the gate driving unit 30 may be located on a side of the control module 301 of the gate driving unit 30 which is away from at least part of the common transmission signal lines 4. FIG. 8 is a schematic diagram showing that the output module 302 of the gate driving unit 30 is located on a side of the control module 301 of the gate driving unit 30 which is away from the first clock signal line CK and the second clock signal line XCK. With such a configuration, during configuration of the connection line (not shown) between the control module 301 and the first clock signal line CK and configuration of the connection line (not shown) between the control module 301 and the second clock signal line XCK, the length of the connection line can be reduced, which helps reduce the layout complexity of the display panel.

During arrangement of the light-emitting driving units and the gate driving units, in an embodiment, as shown in FIG. 8, in the embodiments of the present disclosure, the light-emitting driving units 20 and the gate driving units 30 may be arranged along the second direction h2, to reduce the overall length of the light-emitting driving units 20 and the gate driving units 30 in the first direction h1.

Figure 11:
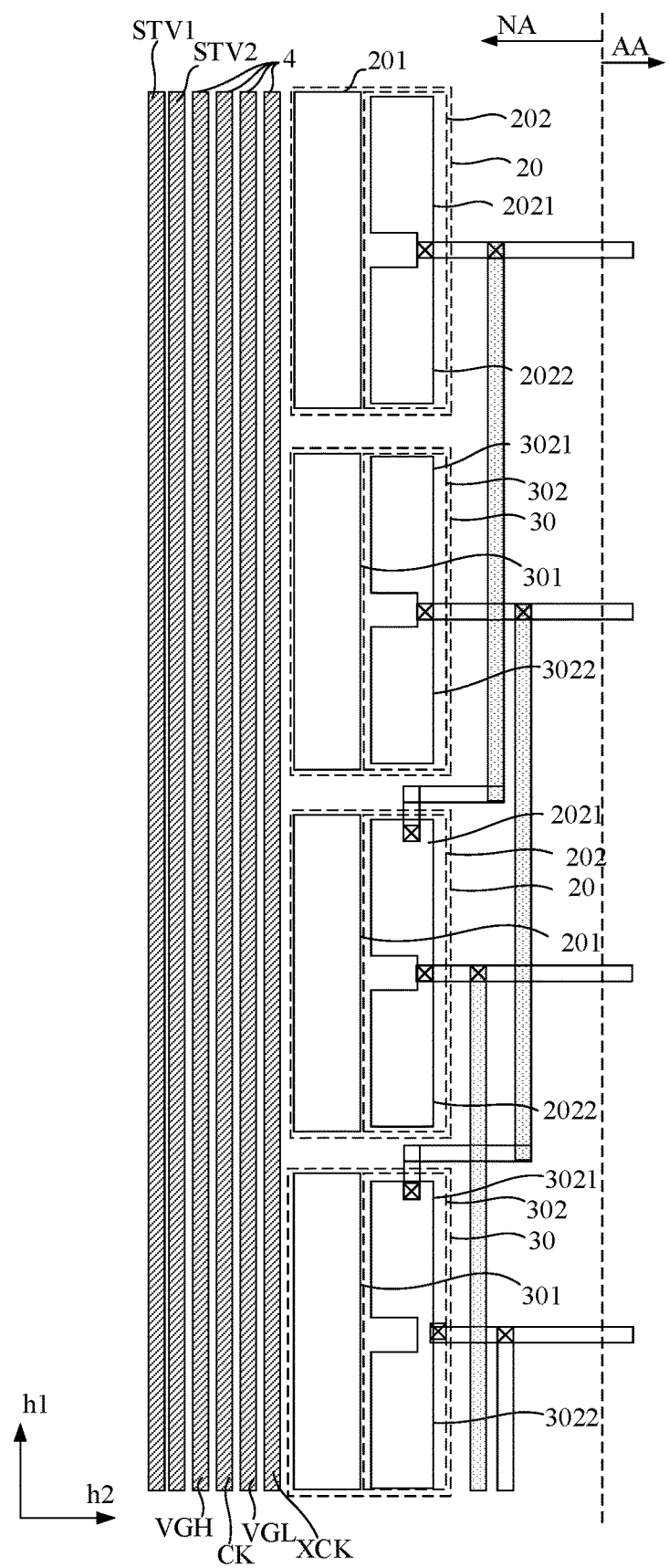
FIG. 11 is a schematic diagram of another simplified layout of light-emitting driving units and gate driving units according to an embodiment of the present disclosure.

Alternatively, FIG. 11 is a schematic diagram of another simplified layout of light-emitting driving units and gate driving units according to an embodiment of the present disclosure; as shown in FIG. 11, in the embodiments of the present disclosure, the light-emitting driving units 20 and the gate driving units 30 may be arranged along the first direction h1, to reduce the overall width of the light-emitting driving units 20 and the gate driving units 30 in the second direction h2.

As shown in FIG. 11, in the embodiments of the present disclosure, the output module 202 of the light-emitting driving unit 20 may be located on a side of the control module 201 of the light-emitting driving unit 20 which is away from at least part of the common transmission signal lines 4, and the output module 302 of the gate driving unit 30 is located on a side of the control module 301 of the gate driving unit 30 which is away from at least part of the common transmission signal lines 4, to reduce the distance between the common transmission signal line 4 and the control module 301 and reduce the length of the connection line (not shown) between the common transmission signal line 4 and the control module 301, thereby reducing the layout complexity of the display panel.

For example, as shown in FIG. 11, in the embodiments of the present disclosure, the light-emitting driving units 20 and the gate driving units 30 are arranged alternately in the first direction h1.

When the light-emitting driving units 20 and the gate driving unit 30 are arranged along the second direction h2 in the embodiments of the present disclosure, at least part of the common transmission signal lines 4 may be located between the light-emitting driving units 20 and the gate driving units 30. FIG. 8 shows an example in which the first voltage signal line VGH is located on a side of the light-emitting driving unit 20 that is away from the gate driving unit 30, and the second voltage signal line VGL, the first clock signal line CK, and the second clock signal line XCK are located between the light-emitting driving unit 20 and the gate driving unit 30. Such a configuration can reduce the distances from the second voltage signal line VGL, the first clock signal line CK, and the second clock signal line XCK to the light-emitting driving unit 20 and the gate driving unit 30 at the same time.

When the light-emitting driving units 20 and the gate driving units 30 are arranged along the first direction h1, as shown in FIG. 11, in the embodiments of the present disclosure, the light-emitting driving units 20 and the gate driving units 30 are located on the same side of at least part of the common transmission signal lines 4. FIG. 11 shows an example in which the first voltage signal line VGH, the second voltage signal line VGL, the first clock signal line CK, and the second clock signal line XCK are all located on the left side of the light-emitting driving units 20 and the gate driving units 30.

For example, as shown in FIG. 8 and FIG. 11, in the embodiments of the present disclosure, the second clock signal line XCK is located on a side of the light-emitting driving units 20 that is away from the display region AA, the second voltage signal line VGL is located on a side of the second clock signal line XCK that is away from the display region AA, the first clock signal line CK is located on a side of the second voltage signal line VGL that is away from the display region AA, and the first voltage signal line VGH is located on a side of the first clock signal line CK that is away from the display region AA.

For example, as shown in FIG. 9 and FIG. 10, the output module 202 of the light-emitting driving unit 20 includes a first output transistor 2021 and a second output transistor 2022; a first electrode of the first output transistor 2021 of the light-emitting driving unit 20 is electrically connected to the output terminal OUT1 of the light-emitting driving unit 20, and a first electrode of the second output transistor 2022 of the light-emitting driving unit 20 is electrically connected to the output terminal OUT1 of the light-emitting driving unit 20.

As shown in FIG. 8 and FIG. 11, in the embodiments of the present disclosure, the first output transistor 2021 of the light-emitting driving unit 20 and the second output transistor 2022 of the light-emitting driving unit 20 are arranged along the first direction h1, to reduce the width of the output module 202 of the light-emitting driving unit 20 in the second direction h2.

For example, as shown in FIG. 9 and FIG. 10, the output module 302 of the gate driving unit 30 includes a first output transistor 3021 and a second output transistor 3022; a first electrode of the first output transistor 3021 of the gate driving unit 30 is electrically connected to the output terminal OUT2 of the gate driving unit 30, and a first electrode of the second output transistor 3022 of the gate driving unit 30 is electrically connected to the output terminal OUT2 of the gate driving unit 30.

As shown in FIG. 8 and FIG. 11, in the embodiments of the present disclosure, the first output transistor 3021 of the gate driving unit 30 and the second output transistor 3022 of the gate driving unit 30 are arranged along the first direction h1, to reduce the width of the output module 202 of the light-emitting driving unit 20 in the second direction h2.

Figure 12:
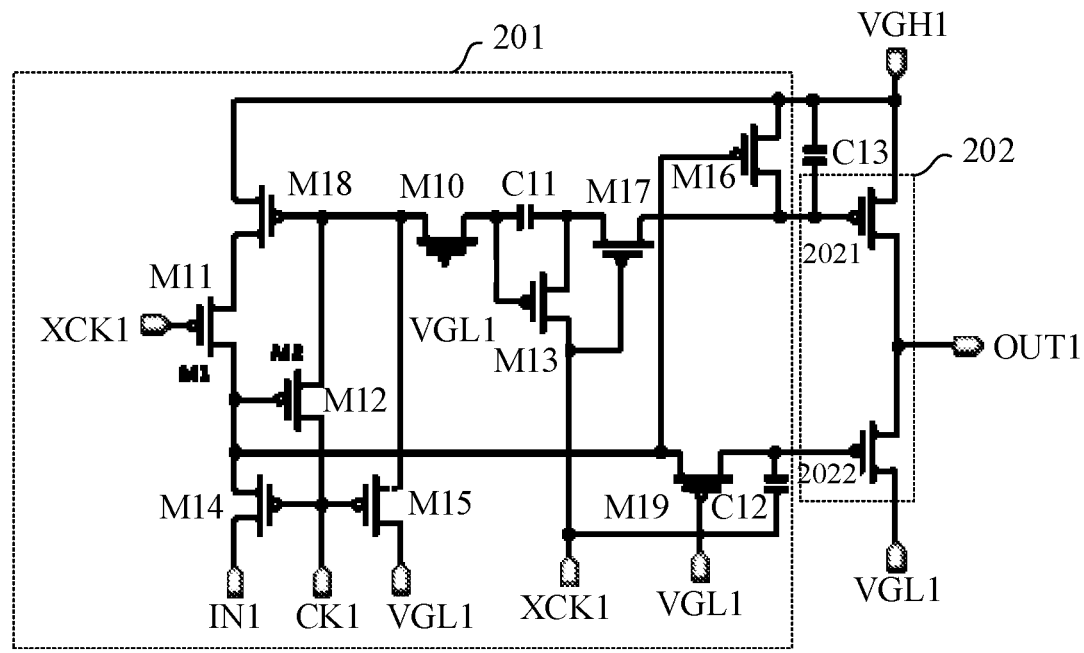
FIG. 12 is a schematic circuit diagram of another light-emitting driving unit according to an embodiment of the present disclosure.

During configuration of the control module 201 of the light-emitting driving unit 20, In an embodiment, FIG. 12 is a schematic circuit diagram of another light-emitting driving unit according to an embodiment of the present disclosure; as shown in FIG. 12, the control module 201 of the light-emitting driving unit 20 includes a first transistor M11, a second transistor M12, a third transistor M13, a fourth transistor M14, a fifth transistor M15, a sixth transistor M16, a seventh transistor M17, an eighth transistor M18, a ninth transistor M19, and a tenth transistor M10. A gate of the fourth transistor M14 is electrically connected to a gate of the fifth transistor M15 and the first clock signal terminal CK1. A first electrode of the fourth transistor M14 is electrically connected to the shift signal input terminal IN1, and a second electrode of the fourth transistor M14 is electrically connected to a second electrode of the first transistor M11, a gate of the second transistor M12, a gate of the sixth transistor M16, and a first electrode of the ninth transistor M19; a gate of the first transistor M11; is electrically connected to the second clock signal terminal XCK1; a first electrode of the second transistor M12 is electrically connected to the first clock signal terminal CK1, and a second electrode of the second transistor M12 is electrically connected to a gate of the eighth transistor M18 and a first electrode of the tenth transistor M10; a first electrode of the eighth transistor M18 is electrically connected to the first level signal terminal VGH1, and a second electrode of the eighth transistor M18 is electrically connected to a first electrode of the first transistor M11; a first electrode of the fifth transistor M15 is electrically connected to the second level signal terminal VGL1; gates of the ninth transistor M19 and the tenth transistor M10 are both electrically connected to the second level signal terminal VGL1; a second electrode of the ninth transistor M19 is electrically connected to a gate of the second output transistor 2022; a second electrode of the tenth transistor M10 is electrically connected to a gate of the third transistor M13; a first electrode of the third transistor M13 and a gate of the seventh transistor M17 are both electrically connected to the second clock signal terminal XCK1; a second electrode of the third transistor M13 is electrically connected to a first electrode of the seventh transistor M17; a first electrode of the sixth transistor M16 is electrically connected to the first level signal terminal VGH1, and a second electrode of the sixth transistor M16 and a second electrode of the seventh transistor M17 are both electrically connected to a gate of the first output transistor 2021.

As shown in FIG. 12, in the embodiments of the present disclosure, a second electrode of the first output transistor 2021 of the light-emitting driving unit 20 is electrically connected to the first level signal terminal VGH1, and a second electrode of the second output transistor 2022 is electrically connected to the second level signal terminal VGL1.

As shown in FIG. 12, the light-emitting driving unit 20 further includes a first capacitor C11, a second capacitor C12, and a third capacitor C13. The first capacitor C11 is electrically connected to the second electrode of the tenth transistor M10 and the first electrode of the seventh transistor M17; the second capacitor C12 is electrically connected to the second clock signal terminal XCK1 and the gate of the second output transistor 2022; the third capacitor C13 is electrically connected to the first level signal terminal VGH1 and the gate of the first output transistor 2021.

In an embodiment, in the embodiments of the present disclosure, the light-emitting driving unit 20 works according to the sequence shown in FIG. 6.

Figure 13:
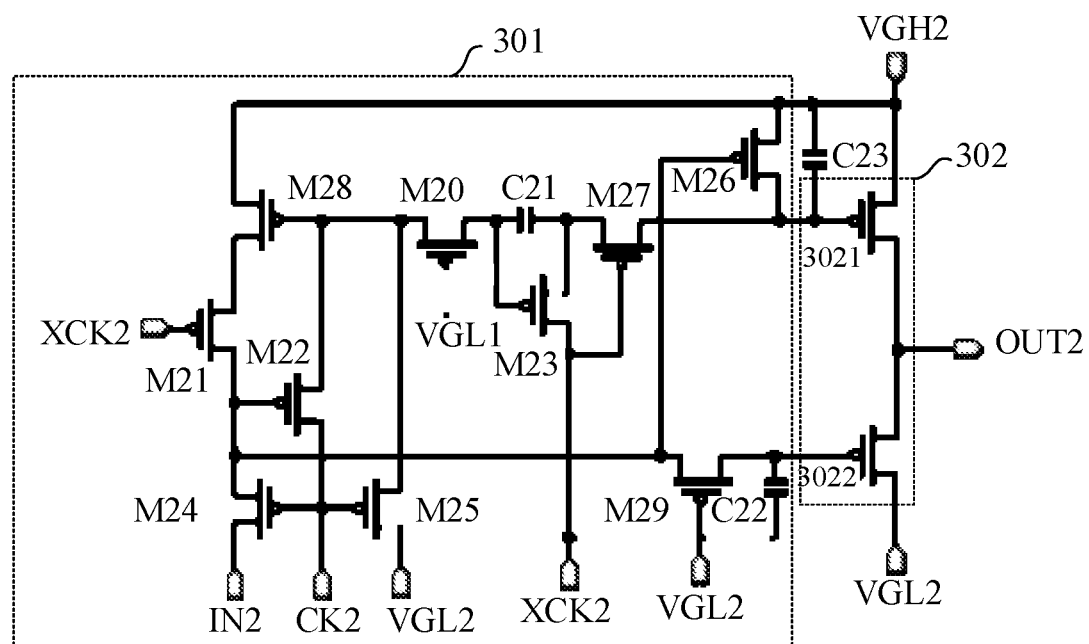
FIG. 13 is a schematic circuit diagram of another gate driving unit according to an embodiment of the present disclosure.

During configuration of the control module of the gate driving unit 30, for example, FIG. 13 is a schematic circuit diagram of another gate driving unit according to an embodiment of the present disclosure; as shown in FIG. 13, in the embodiments of the present disclosure, the circuit structure of the control module of the gate driving unit is the same as that of the light-emitting driving unit. Specifically, the control module 301 of the gate driving unit 30 includes a first transistor M21, a second transistor M22, a third transistor M23, a fourth transistor M24, a fifth transistor M25, a sixth transistor M26, a seventh transistor M27, an eighth transistor M28 a ninth transistor M29, and a tenth transistor M20. A gate of the fourth transistor M24 is electrically connected to a gate of the fifth transistor M25 and the first clock signal terminal CK2. A first electrode of the fourth transistor M24 is electrically connected to the shift signal input terminal IN2, and a second electrode of the fourth transistor M24 is electrically connected to a second electrode of the first transistor M21, a gate of the second transistor M22, a gate of the sixth transistor M26, and a first electrode of the ninth transistor M29; a gate of the first transistor M21 is electrically connected to the second clock signal terminal XCK2; a first electrode of the second transistor M22 is electrically connected to the first clock signal terminal CK2, and a second electrode of the second transistor M22 is electrically connected to a gate of the eighth transistor M28 and a first electrode of the tenth transistor M20; a first electrode of the eighth transistor M28 is electrically connected to the first level signal terminal VGH2, and a second electrode of the eighth transistor M28 is electrically connected to a first electrode of the first transistor M21; a first electrode of the fifth transistor M25 is electrically connected to the second level signal terminal VGL2; gates of the ninth transistor M29 and the tenth transistor M20 are both electrically connected to the second level signal terminal VGL2; a second electrode of the ninth transistor M29 is electrically connected to a gate of the second output transistor 3022; a second electrode of the tenth transistor M20 is electrically connected to a gate of the third transistor M23; a first electrode of the third transistor M23 and a gate of the seventh transistor M27 are both electrically connected to the second clock signal terminal XCK2; a second electrode of the third transistor M23 is electrically connected to a first electrode of the seventh transistor M27; a first electrode of the sixth transistor M26 is electrically connected to the first level signal terminal VGH2, and a second electrode of the sixth transistor M26 and a second electrode of the seventh transistor M27 are both electrically connected to a gate of the first output transistor 3021.

As shown in FIG. 13, in the embodiments of the present disclosure, a second electrode of the first output transistor 3021 of the gate driving unit 30 is electrically connected to the first level signal terminal VGH2, and a second electrode of the second output transistor 3022 is electrically connected to the second level signal terminal VGL2.

As shown in FIG. 13, the gate driving unit 30 further includes a first capacitor C21, a second capacitor C22, and a third capacitor C23. The first capacitor C21 is electrically connected to the second electrode of the tenth transistor M20 and the first electrode of the seventh transistor M27; the second capacitor C22 is electrically connected to the second clock signal terminal XCK2 and the gate of the second output transistor 3022; the third capacitor C23 is electrically connected to the first level signal terminal VGH2 and the gate of the first output transistor 3021.

In an embodiment, in the embodiments of the present disclosure, the gate driving unit 30 works according to the sequence shown in FIG. 7.

Figure 14:
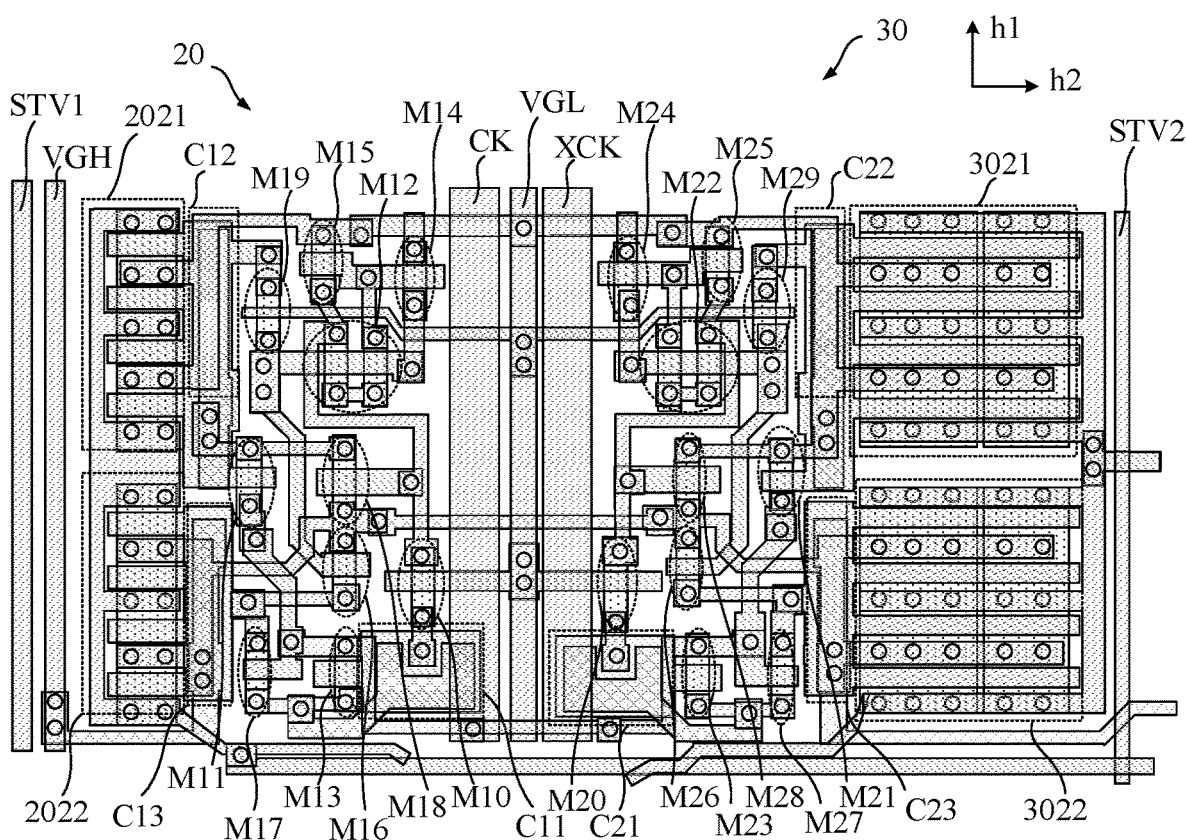
FIG. 14 is a schematic diagram of further another layout of a light-emitting driving unit and a gate driving unit according to an embodiment of the present disclosure.
Figure 15:
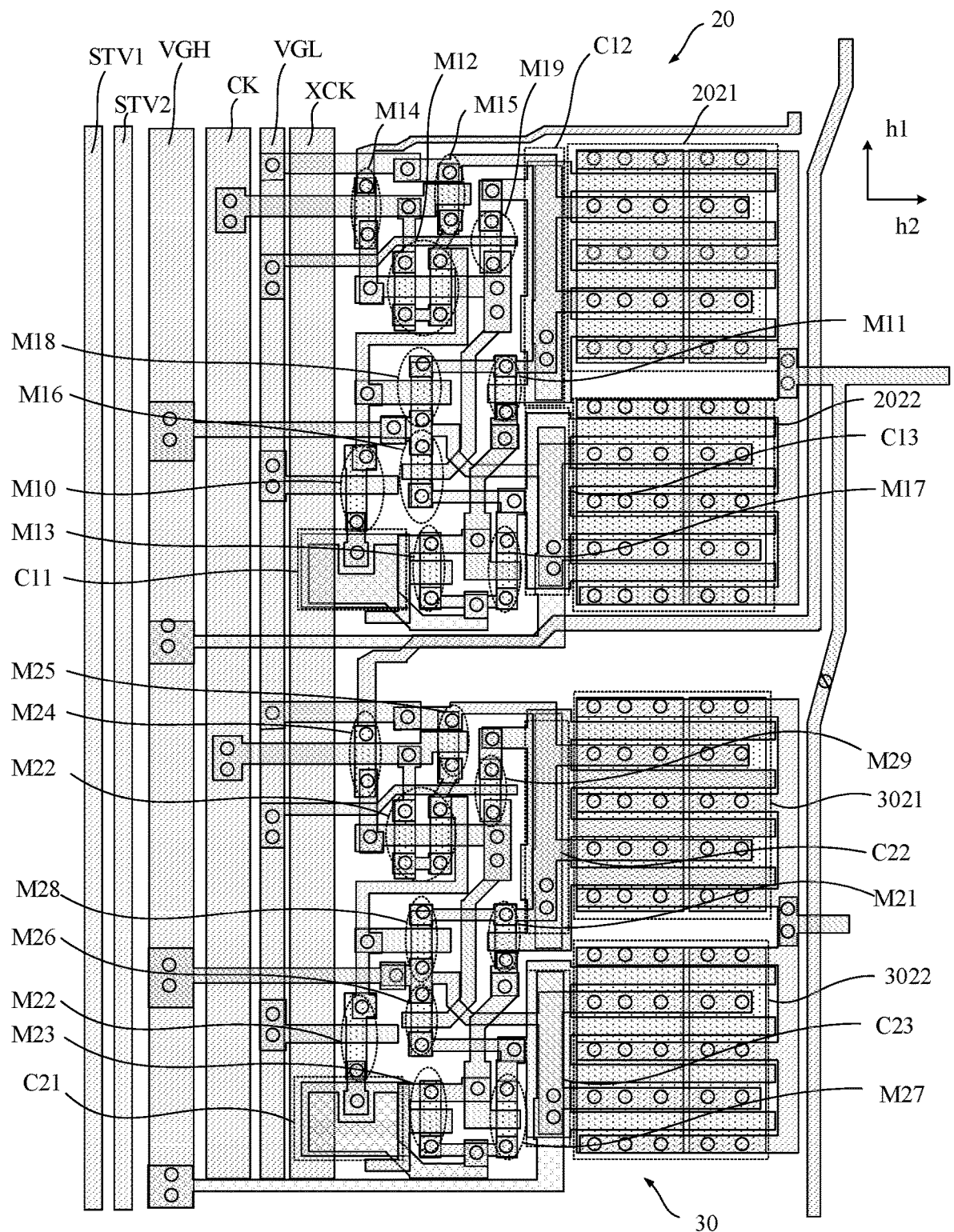
FIG. 15 is a schematic diagram of further another layout of a light-emitting driving unit and a gate driving unit according to an embodiment of the present disclosure.

For example, as shown in FIG. 14 and FIG. 15, FIG. 14 and FIG. 15 are schematic diagrams of another two layouts of the light-emitting driving unit and the gate driving unit according to an embodiment of the present disclosure. In FIG. 14, the light-emitting driving unit 20 and the gate driving unit 30 are arranged along the second direction h2, and in FIG. 15, the light-emitting driving unit 20 and the gate driving unit 30 are arranged along the first direction h1.

As shown in FIG. 14 and FIG. 15, in the light-emitting driving unit 20, the second capacitor C12 and the first output transistor 2021 are arranged along the second direction h2, and the ninth transistor M19 is located on a side of the second capacitor C12 that is away from the first output transistor 2021; the fifth transistor M15 is located on a side of the ninth transistor M19 that is away from the second capacitor C12; the fourth transistor M14 is located on a side of the fifth transistor M15 that is away from the ninth transistor M19; the second transistor M12 is located on a side of the fifth transistor M15 that is close to the light-emitting driving unit 20 in the next stage; the third capacitor C13 and the second output transistor 2022 are arranged along the second direction h2, and the seventh transistor M17 is located on a side of the third capacitor C13 that is away from the second output transistor 2022; the third transistor M13 is located on a side of the seventh transistor M17 that is away from the third capacitor C13, and the first capacitor C11 is located on a side of the third transistor M13 that is away from the seventh transistor M17; the tenth transistor M10 and the first capacitor C11 are arranged along the first direction h1; the sixth transistor M16 and the eighth transistor M18 are arranged along the first direction h1, and both the sixth transistor M16 and the eighth transistor M18 are located on a side of the tenth transistor M10 that is close to the second output transistor 2022; the first transistor M11 is located on a side of the eighth transistor M18 that is close to the first output transistor 2021.

As shown in FIG. 14 and FIG. 15, in the gate driving unit 30, the second capacitor C22 and the first output transistor 3021 are arranged along the second direction h2, and the ninth transistor M29 is located on a side of the second capacitor C22 that is away from the first output transistor 3021; the fifth transistor M25 is located on side of the ninth transistor M29 that is away from the second capacitor C22; the fourth transistor M24 is located on a side of the fifth transistor M25 that is away from the ninth transistor M29; the second transistor M22 is located on a side of the fifth transistor M25 that is close to the gate driving unit 30 in the next stage; the third capacitor C23 and the second output transistor 3022 are arranged along the second direction h2, and the seventh transistor M27 is located on a side of the third capacitor C23 that is away from the second output transistor 3022; the third transistor M23 is located on a side of the seventh transistor M27 that is away from the third capacitor C23, and the first capacitor C21 is located on a side of the third transistor M23 that is away from the seventh transistor M27; the tenth transistor M20 and the first capacitor C21 are arranged along the first direction h1; the sixth transistor M26 and the eighth transistor M28 are arranged along the first direction h1, and both the sixth transistor M26 and the eighth transistor M28 are located on a side of the tenth transistor M20 that is close to the second output transistor 3022; the first transistor M21 is located on side of the eighth transistor M28 that is close to the first output transistor 3021.

In an embodiment, as shown in FIG. 12 and FIG. 13, in the embodiments of the present disclosure, the circuit structure of the control module 201 of the gate driving unit 30 may be the same as that of the control module 301 of the light-emitting driving unit 20. The circuit structures being the same herein means that the control module 201 of the gate driving unit 30 and the control module 301 of the light-emitting driving unit 20 have transistors of the same type, and the connection manners of the transistors in the two modules are also the same. When the circuit structures of the two modules are the same, as shown in FIG. 5, in the embodiments of the present disclosure, the signal inputted to the shift signal input terminal IN1 of the light-emitting driving unit 20 in the first stage may be independent of the signal inputted to the shift signal input terminal IN2 of the $1^{st}$ gate driving unit 30 of the gate driving units 30 that is cascaded. That is, the frame start light-emitting driving signal line STV1 and the frame start node control signal line STV2 shown in FIG. 5 are independent of each other, so that the light-emitting driving unit 20 in each stage and the gate driving unit 30 in each stage output signals required by each pixel driving circuit 12.

Figure 16:
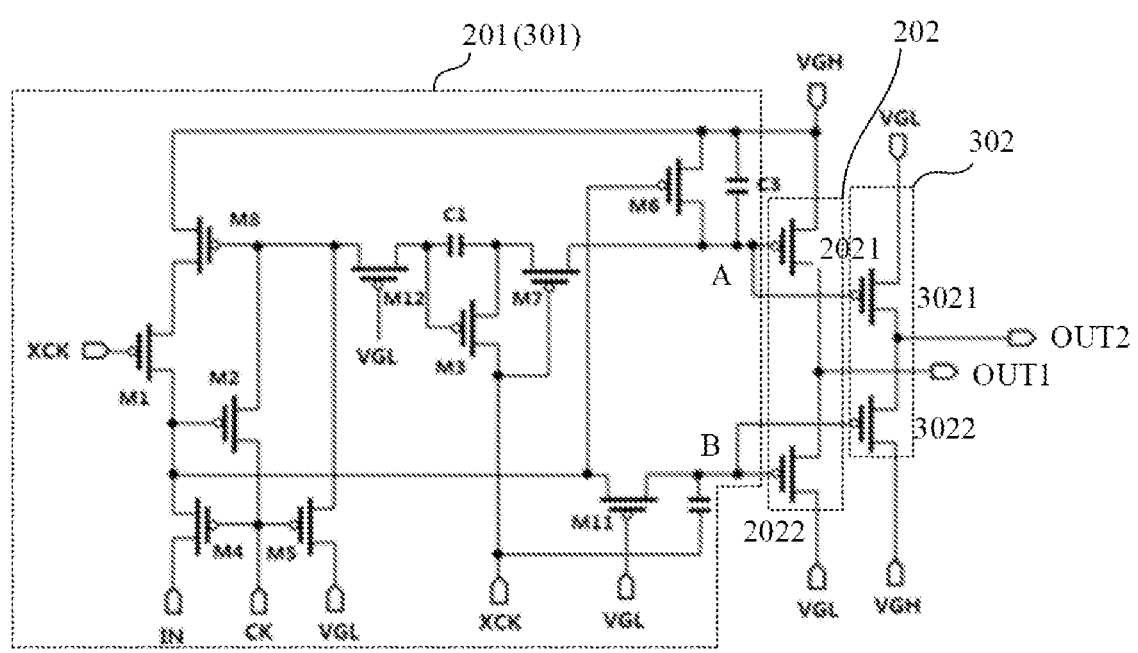
FIG. 16 is a schematic circuit diagram of another light-emitting driving unit and another gate driving unit according to an embodiment of the present disclosure.

Alternatively, when the circuit structure of the control module 201 of the gate driving unit 30 is the same as that of the control module 301 of the light-emitting driving unit 20, in the embodiments of the present disclosure, the frame start light-emitting driving signal line STV1 electrically connected to the light-emitting driving unit 20 and the frame start gate driving signal line STV2 electrically connected to the gate driving unit 30 have the same signal. In this case, in the embodiments of the present disclosure, the control module 201 of the light-emitting driving unit 20 is reused as the control module 301 of the gate driving unit 30. FIG. 16 is a schematic circuit diagram of another light-emitting driving circuit and another gate driving circuit according to an embodiment of the present disclosure; as shown in FIG. 16, the control module 201 of the light-emitting driving unit 20 is reused as the control module 301 of the gate driving unit 30. Specifically, as shown in FIG. 12 and FIG. 13, in the embodiments of the present disclosure, the first transistor M11 of the light-emitting driving unit may be reused as the first transistor M21 of the gate driving unit 30. In FIG. 16, the first transistor M11 of the light-emitting driving unit and the first transistor M21 of the gate driving unit are denoted by M1; similarly, M2 represents the second transistor M12 of the light-emitting driving unit and the first transistor M22 of the gate driving unit . . . , M9 represents the ninth transistor M19 of the light-emitting driving unit and the first transistor M29 of the gate driving unit, and M0 represents the tenth transistor M10 of the light-emitting driving unit and the first transistor M20 of the gate driving unit.

For example, as shown in FIG. 16, the gate of the first output transistor 2021 of the light-emitting driving unit 20 and the gate of the first output transistor 3021 of the gate driving unit 30 are both electrically connected to the first control signal output terminal A of the control module 201; the gate of the second output transistor 2022 of the light-emitting driving unit 20 and the gate of the second output transistor 3022 of the gate driving unit 30 are both electrically connected to the second control signal output terminal B of the control module 201.

In the embodiments of the present disclosure, the second electrode of the first output transistor 2021 of the light-emitting driving unit 20 and the second electrode of the first output transistor 3021 of the gate driving unit 30 receive different signals. The second electrode of the second output transistor 2022 of the light-emitting driving unit 20 and the second electrode of the second output transistor 3022 of the gate driving unit 30 receive different signals. For example, in the embodiments of the present disclosure, the signal received by the second electrode of the first output transistor 2021 of the light-emitting driving unit 20 and the signal received by the second electrode of the second output transistor 2022 may be designed according to the light-emitting driving signal required by the pixel driving circuit, and the signal received by the second electrode of the first output transistor 3021 of the gate driving unit 30 and the signal received by the second electrode of the second output transistor 3022 may be designed according to the node control signal required by the pixel driving circuit. As shown in FIG. 16, in the embodiments of the present disclosure, the second electrode of the first output transistor 2021 of the light-emitting driving unit 20 is electrically connected to the first voltage signal line VGH, the second electrode of the second output transistor 2022 of the light-emitting driving unit 20 is electrically connected to the second voltage signal line VGL, the second electrode of the first output transistor 3021 of the gate driving unit 30 is electrically connected to the second voltage signal line VGL, and the second electrode of the second output transistor 3022 of the gate driving unit 30 is electrically connected to the first voltage signal line VGH.

When the control module 201 of the light-emitting driving unit 20 is reused as the control module 301 of the gate driving unit 30, as shown in FIG. 16, in the embodiments of the present disclosure, the shift signal input terminal IN of the control module 201 in the current stage is electrically connected to the output terminal OUT1 of the light-emitting driving unit 20 in the upper stage.

Figure 17:
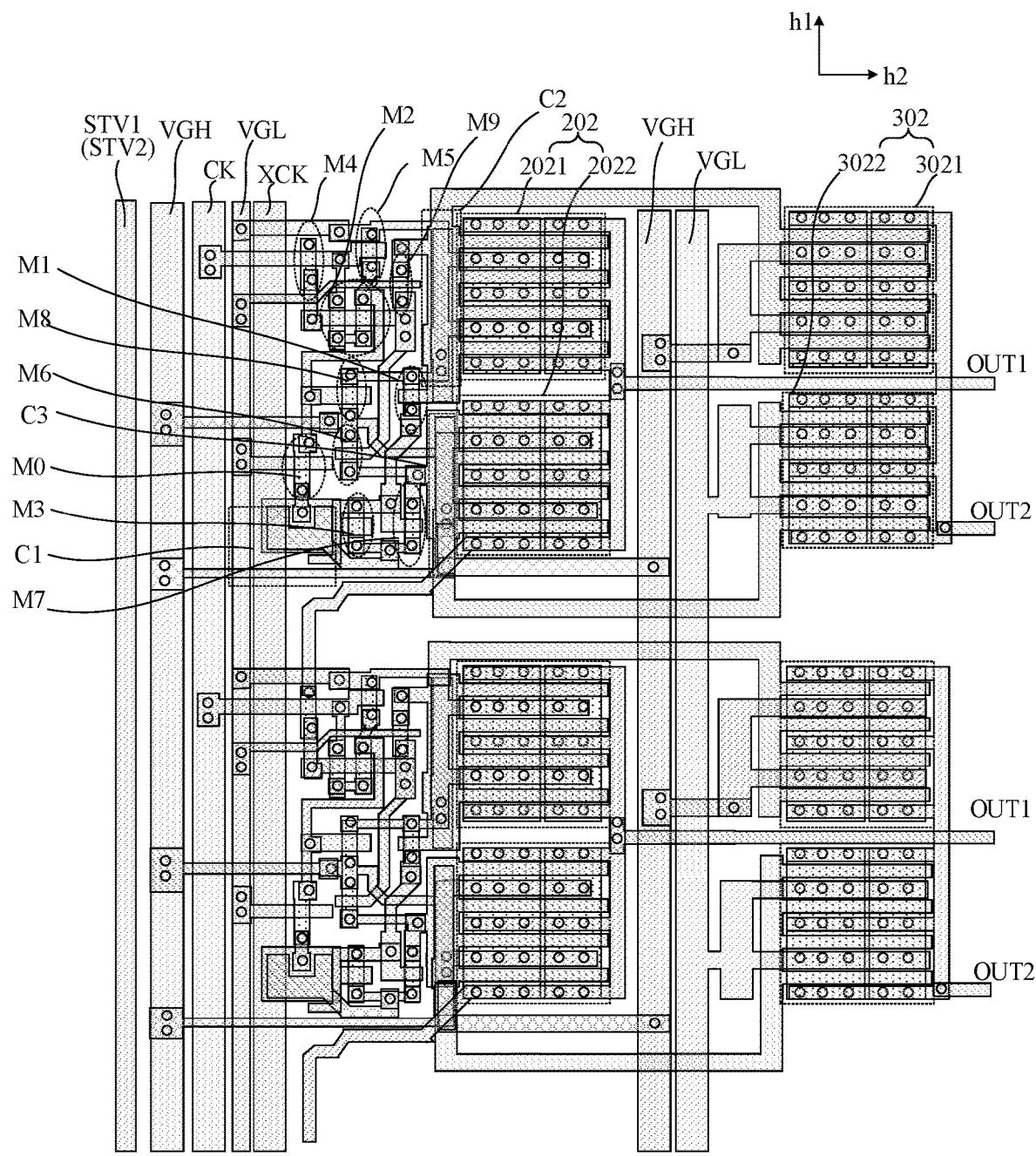
FIG. 17 is a schematic diagram of further another layout of a light-emitting driving unit and a gate driving unit according to an embodiment of the present disclosure.

In an embodiment, FIG. 17 is a schematic diagram of further another layout of a light-emitting driving unit and a gate driving unit according to an embodiment of the present disclosure. As shown in FIG. 17, the control module 201 of the light-emitting driving unit 20 is reused as the control module 301 of the gate driving unit 30; in the control module 201, the second capacitor C2 and the first output transistor 2021 of the light-emitting driving unit 20 are arranged along the second direction h2, and the ninth transistor M9 is located on a side of the second capacitor C2 that is away from the first output transistor 2021; the fifth transistor M5 is located on a side of the ninth transistor M9 that is away from the second capacitor C2; the fourth transistor M4 is located on a side of the fifth transistor M5 that is away from the ninth transistor M9; the second transistor M2 is located on a side of the fifth transistor M5 that is close to the control module 201 in the next stage; the third capacitor C3 and the second output transistor 2022 of the light-emitting driving unit 20 are arranged along the second direction h2, and the seventh transistor M7 is located on a side of the third capacitor C3 that is away from the second output transistor 2022; the third transistor M3 is located on a side of the seventh transistor M7 that is away from the third capacitor C3, and the first capacitor C1 is located on side of the third transistor M3 that is away from the seventh transistor M7; the tenth transistor M0 and the first capacitor C1 are arranged along the first direction h1; the sixth transistor M6 and the eighth transistor M8 are arranged along the first direction h1, and both the sixth transistor M6 and the eighth transistor M8 are located on a side of the tenth transistor M0 that is close to the second output transistor 2022.

In the embodiments of the present disclosure, the control module 201 of the light-emitting driving unit 20 is reused as the control module 301 of the gate driving unit 30, which can reduce the quantity of transistors in the non-display region NA, to further reduce the bezel width of the display panel. Moreover, with such a configuration, in the embodiments of the present disclosure, the frame start light-emitting driving signal line STV1 can further be reused as the frame start gate driving signal line STV2, which can reduce the quantity of signal lines in the non-display region NA.

In an embodiment, during configuration of the output module 302 of the gate driving unit 30 and the output module 202 of the light-emitting driving unit 20, as shown in FIG. 17, in the embodiments of the present disclosure, the output module 302 of the gate driving unit 30 may be located on a side of the output module 202 of the light-emitting driving unit 20 that is away from the control module 201.

Alternatively, in the embodiments of the present disclosure, the output module 202 of the light-emitting driving unit 20 may be located on a side of the output module 302 of the gate driving unit 30 that is away from the control module 201, which is not illustrated with figures herein.

In an embodiment, when the control module 201 of the light-emitting driving unit 20 is reused as the control module 301 of the gate driving unit 30, in the embodiments of the present disclosure, at least part of the common transmission signal lines 4 may be located on a side of the control module 201 that is away from the output module 302 of the gate driving unit 30, and the same common transmission signal lines 4 are located on a side of the control module 201 that is away from the output module 202 of the light-emitting driving unit 20. FIG. 17 is a schematic diagram showing that the first clock signal line CK and the second clock signal line XCK are used as the common transmission signal lines 4, and both the first clock signal line CK and the second clock signal line XCK are located on a side of the control module 201 that is away from the output module 302 of the gate driving unit 30.

For example, as shown in FIG. 14, FIG. 15, and FIG. 17, in the embodiments of the present disclosure, a channel area of the first output transistor 3021 of the gate driving unit 30 may be larger than or equal to the area of any transistor in the control module 301 of the gate driving unit 30; alternatively, a channel area of the second output transistor 3022 of the gate driving unit 30 is larger than or equal to the area of any transistor in the control module 301 of the gate driving unit 30.

As shown in FIG. 2, in the embodiments of the present disclosure, the node control signal of the gate driving unit 30 is used for controlling operation of the node control module 121 in the pixel driving circuit 12, wherein the node control module 121 is electrically connected to the gate of the drive transistor M0, and the potential of the gate of the drive transistor M0 is related to the brightness of the light-emitting unit 11. In the embodiments of the present disclosure, by increasing the channel area of the first output transistor 3021 or the second output transistor 3022 of the gate driving unit 30, the signal delay of the node control signal outputted by the gate driving unit 30 can be reduced, to ensure sufficient charging for the gate of the drive transistor M0 in the pixel driving circuit 12.

In an embodiment, as shown in FIG. 14, when the light-emitting driving unit 20 and the gate driving unit 30 are arranged along the second direction h2, in the embodiments of the present disclosure, the transistors in the control module 201 of the light-emitting driving unit 20 and the transistors in the control module 301 of the gate driving unit 30 may be symmetrical about the second voltage signal line VGL. In this way, the layout is more compact.

Figure 18:
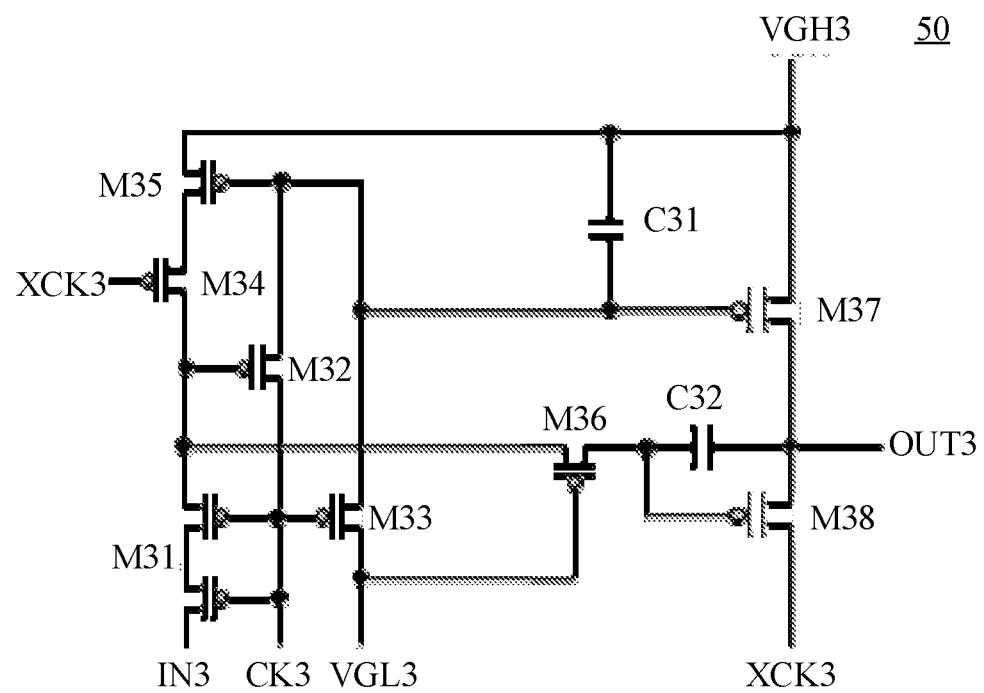
FIG. 18 is a schematic circuit diagram of a scan driving unit according to an embodiment of the present disclosure.

For example, as shown in FIG. 1, the non-display region NA further includes a scan driving circuit 5, and the scan driving circuit 5 includes a plurality of cascaded scan driving units 50 arranged along the first direction h1. For example, FIG. 18 is a schematic circuit diagram of a scan driving unit according to an embodiment of the present disclosure; as shown in FIG. 18, the scan driving unit 50 includes a first transistor M31, a second transistor M32, a third transistor M33, a fourth transistor M34, a fifth transistor M35, a sixth transistor M36, a seventh transistor M37, a first capacitor C31, and a second capacitor C32. Gates of the first transistor M31 and the third transistor M33 are both electrically connected to the first clock signal terminal CK3; a first electrode of the first transistor M31 is electrically connected to the shift signal input terminal IN3; a second electrode of the first transistor M31 is electrically connected to a gate of the second transistor M32, a first electrode of the fourth transistor M34, and a first electrode of the sixth transistor M36; a first electrode of the second transistor M32 is electrically connected to the first clock signal terminal CK3; a second electrode of the second transistor M32 is electrically connected to a gate of the fifth transistor M35; a gate of the fourth transistor M34 is electrically connected to the second clock signal terminal XCK3; a second electrode of the fourth transistor M34 is electrically connected to a first electrode of the fifth transistor M35; a second electrode of the fifth transistor M35 is electrically connected to the first level signal terminal VGH3; a first electrode of the third transistor M33 is electrically connected to the second level signal terminal VGL3, and a second electrode of the third transistor M33 is electrically connected to a gate of the seventh transistor M37. A first electrode of the seventh transistor M37 is electrically connected to the first level signal terminal VGH3, and a second electrode of the seventh transistor M37 is electrically connected to the output terminal OUT3 of the scan driving unit 50. A gate of the sixth transistor M36 is electrically connected to the second level signal terminal VGL3, and a second electrode of the sixth transistor M36 is electrically connected to a gate of the eighth transistor M38; a first electrode of the eighth transistor M38 is electrically connected to the second clock signal terminal XCK3, and a second electrode of the eighth transistor M38 is electrically connected to the output terminal OUT3 of the scan driving unit 50. The output terminal OUT3 of the scan driving unit in each stage of the scan driving circuit is electrically connected to the corresponding pixel driving circuit 11.

In the embodiments of the present disclosure, the cascaded scan driving units 50 represent that the output terminal OUT3 of the scan driving unit 50 in an upper stage is electrically connected to the shift signal input terminal IN3 of the scan driving unit in a lower stage. The non-display region further includes a frame start scan driving signal line. In the embodiments of the present disclosure, the shift signal input terminal IN3 of the $1^{st}$ scan driving unit of the scan driving units that is cascaded is electrically connected to the frame start scan driving signal line. Multiple stages of the scan driving units in the scan driving circuit can sequentially output scan control signals.

As shown in FIG. 2, the pixel driving circuit 12 includes a first scanning control terminal S1 and a second scanning control terminal S2. For example, in the embodiments of the present disclosure, the output terminal of the scan driving unit in the i-th stage may be electrically connected to the second scanning control terminal S2 of the pixel driving circuit in the i-th row and the first scanning control terminal S1 of the pixel driving circuit in the (i+1)-th row.

During configuration of the scan driving unit 50, as shown in FIG. 1, in the embodiments of the present disclosure, the scan driving unit 50 may be located on a side of the light-emitting driving unit 20 that is away from the gate driving unit 30, and the display region AA may be located on a side of the scan driving unit 50 that is away from the gate driving unit 30.

Alternatively, in the embodiments of the present disclosure, the scan driving unit 50 may be located on a side of the gate driving unit 30 that is away from the light-emitting driving unit 20, and the display region AA may be located on a side of the scan driving unit 50 that is away from the gate driving unit 30, which is not illustrated with figures herein.

Figure 19:
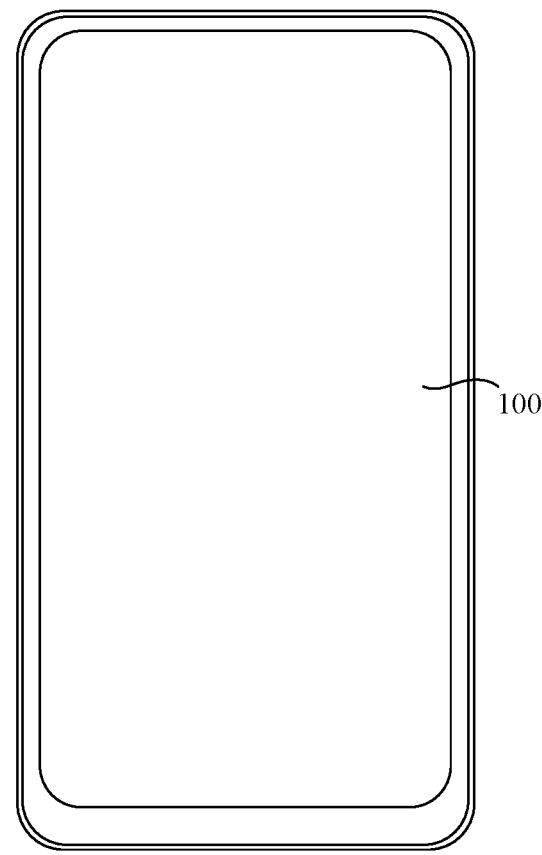
FIG. 19 is a schematic diagram of a display apparatus according to an embodiment of the present disclosure.

The embodiments of the present disclosure further provide a display apparatus. FIG. 19 is a schematic diagram of a display apparatus according to an embodiment of the present disclosure. As shown in FIG. 19, the display apparatus includes the foregoing display panel 100. A specific structure of the display panel 100 has been described in detail in the foregoing embodiment. Details are not described herein again. Certainly, the display apparatus shown in FIG. 19 is for schematic description only. The display apparatus may be any electronic device with a display function, such as a mobile phone, a tablet computer, a notebook computer, an ebook, or a television.

The above descriptions are merely preferred embodiments of the present disclosure, and are not intended to limit the present disclosure. Any modifications, equivalent replacements, improvements, and the like made within the spirit and principle of the present disclosure shall fall within the protection scope of the present disclosure.

What is claimed is:

1. A display panel, comprising:
a pixel driving circuit comprising a light-emitting control signal terminal and a node control signal terminal; and
a light-emitting driving circuit comprising a plurality of light-emitting driving units that are cascaded and arranged along a first direction, wherein an output terminal of each of the plurality of light-emitting driving units transmits a light-emitting control signal to the light-emitting control signal terminal;
a gate driving circuit comprising a plurality of gate driving units that are cascaded and arranged along the first direction, wherein an output terminal of each of the plurality of gate driving units transmits a node control signal to the node control signal terminal; and
a common transmission signal line,
wherein at least part of input terminals of the plurality of light-emitting driving units and at least part of input terminals of the plurality of gate driving units are connected to a same common transmission signal line, and
wherein signals inputted to the at least part of input terminals of the plurality of light-emitting driving units and the at least part of input terminals of the plurality of gate driving units are the same,
wherein each of the plurality of light-emitting driving units comprises a control module and an output module, a control signal output terminal of the control module of the light-emitting driving unit is electrically connected to the output module of the light-emitting driving unit, and the output module of the light-emitting driving unit is electrically connected to the output terminal of the light-emitting driving unit; and each of the plurality of gate driving units comprises a control module and an output module, a control signal output terminal of the control module of the gate driving units is electrically connected to the output module of the gate driving unit, and the output module of the gate driving unit is electrically connected to the output terminal of the gate driving unit;
wherein the output module of each of the plurality of light-emitting driving units and the control module of each of the plurality of light-emitting driving units are arranged along a second direction; and the second direction intersects the first direction; and the output module of each of the plurality of gate driving units and the control module of each of the plurality of gate driving units are arranged along the second direction;
wherein the output module of each of the plurality of light-emitting driving units is located on a side of the control module of each of the plurality of light-emitting driving units that is away from the common transmission signal line; and the output module of each of the plurality of gate driving units is located on a side of the control module of each of the plurality of gate driving units that is away from the common transmission signal line.

2. The display panel according to claim 1, wherein:
the common transmission signal line extends along the first direction;
the display panel comprises a first voltage signal line, a second voltage signal line, a first clock signal line, and a second clock signal line; and
the common transmission signal line comprises at least one of the first voltage signal line, the second voltage signal line, the first clock signal line, or the second clock signal line.

3. The display panel according to claim 1, wherein:
the output module of each of the plurality of light-emitting driving units comprises a first output transistor and a second output transistor; a first electrode of the first output transistor is electrically connected to the output terminal of the light-emitting driving unit;
a first electrode of the second output transistor is electrically connected to the output terminal of the light-emitting driving unit; and
the first output transistor of the light-emitting driving unit and the second output transistor of the light-emitting driving unit are arranged along the first direction; and
the output module of each of the plurality of gate driving units comprises a first output transistor and a second output transistor;
a first electrode of the first output transistor of the gate d riving unit is electrically connected to the output terminal of the gate driving unit; a first electrode of the second output transistor of the gate driving unit is electrically connected to the output terminal of the gate driving unit; and
the first output transistor and the second output transistor of the gate driving unit are arranged along the first direction.

4. The display panel according to claim 3, wherein:
a channel area of the first output transistor of each of the plurality of gate driving units is larger than or equal to an area of any transistor in the control module of each of the plurality of gate driving units; or a channel area of the second output transistor of the gate driving unit is larger than or equal to an area of any transistor in the control module of each of the plurality of gate driving units.

5. The display panel according to claim 3, wherein:
the control module of one of the plurality of light-emitting driving unit is reused as the control module of one of the plurality of gate driving unit;

a gate of the first output transistor of each of the plurality of light-emitting driving unit and a gate of the first output transistor of each of the plurality of gate driving unit are both electrically connected to a first control signal output terminal of the control module; and a second electrode of the first output transistor of each of the plurality of light-emitting driving unit and a second electrode of the first output transistor of each of the plurality of gate driving unit receive different signals; and a gate of the second output transistor of each of the plurality of light-emitting driving unit and a gate of the second output transistor of each of the plurality of gate driving unit are both electrically connected to a second control signal output terminal of the control module; and a second electrode of the second output transistor of each of the plurality of light-emitting driving unit and a second electrode of the second output transistor of each of the plurality of gate driving unit receive different signals.

6. The display panel according to claim 5, further comprising a frame start light-emitting driving signal line and a frame start gate driving signal line, wherein the frame start light-emitting driving signal line is electrically connected to an input terminal of a $1^{st}$ light-emitting driving unit of the plurality of light-emitting driving unit that is cascaded, and the frame start gate driving signal line is electrically connected to an input terminal of a $1^{st}$ gate driving unit of the plurality of gate driving units that is cascaded; and wherein the frame start light-emitting driving signal line and the frame start gate driving signal line have a same signal.

7. The display panel according to claim 5, wherein:
the output module of each of the plurality of gate driving units is located on a side of the output module of each of the plurality of light-emitting driving units that is away from the control module;
or
the output module of each of the plurality of light-emitting driving units is located on a side of the output module of each of the plurality of gate driving units that is away from the control module.

8. The display panel according to claim 5, wherein:
the common transmission signal line is located on a side of the control module that is away from the output module of each of the plurality of gate driving units; and the common transmission signal line is located on a side of the control module that is away from the output module of each of the plurality of the light-emitting driving units.

9. The display panel according to claim 1, further comprising a frame start light-emitting driving signal line and a frame start gate driving signal line, wherein the frame start light-emitting driving signal line is electrically connected to an input terminal of a $1^{st}$ light-emitting driving unit of the plurality of light-emitting driving units that is cascaded, and the frame start gate driving signal line is electrically connected to an input terminal of a first gate driving unit of the plurality of gate driving units that is cascaded; and the frame start light-emitting driving signal line and the frame start gate driving signal line have different signals.

10. The display panel according to claim 1, wherein:
each of the plurality of light-emitting driving units and each of the plurality of gate driving units are arranged along a second direction;

the common transmission signal line comprises a first voltage signal line, a second voltage signal line, a first clock signal line, and a second clock signal line;
the first voltage signal line is located on a side of each of the plurality of light-emitting driving units that is away from each of the plurality of gate driving units; and
the second voltage signal line, the first clock signal line, and the second clock signal line are located between the plurality of light-emitting driving units and the plurality of gate driving units.

11. The display panel according to claim 10, wherein:
transistors in a control module of each of the plurality of light-emitting driving units and transistors in a control module of each of the plurality of gate driving units are symmetrical about the second voltage signal line.

12. The display panel according to claim 1, wherein:
the common transmission signal line comprises a first voltage signal line, a second voltage signal line, a first clock signal line, and a second clock signal line; and
the plurality of light-emitting driving units and the plurality of gate driving units are located on a same side of the common transmission signal line, and each of the plurality of light-emitting driving units and each of the plurality of gate driving units are arranged along the first direction.

13. The display panel according to claim 12, wherein:
the display panel has a display region, the second clock signal line is located on a side of each of the plurality of light-emitting driving units that is away from the display region; the second voltage signal line is located on a side of the second clock signal line that is away from the display region; the first clock signal line is arranged on a side of the second voltage signal line that is away from the display region; and
the first voltage signal line is arranged on a side of the first clock signal line that is away from the display region.

14. The display panel according to claim 1, wherein:
a circuit of each of the plurality of gate driving units is the same as a circuit of each of the plurality of light-emitting driving units.

15. The display panel according to claim 1, wherein:
the display panel has a display region and a non-display region; the display region is provided with a plurality of sub-pixels; the light-emitting driving circuit and the gate driving circuit are located in the non-display region; the non-display region is further provided with a scan driving circuit, and the scan driving circuit comprises a plurality of scan driving units that is cascaded and arranged along the first direction; and
each of the plurality of scan driving units is located on a side of each of the plurality of gate driving units that is away from each of the plurality of light-emitting driving units, and the display region is located on a side of each of the plurality of scan driving units that is away from each of the plurality of gate driving units;
or
each of the plurality of scan driving units is located on a side of each of the plurality of light-emitting driving units that is away from each of the plurality of gate driving units, and the display region is located on a side of each of the plurality of scan driving units that is away from each of the plurality of gate driving units.

16. The display panel according to claim 1, wherein the pixel driving circuit comprises:
a drive transistor;
a node control module, electrically connected to a gate of the drive transistor, wherein the node control module controls a potential of the gate of the drive transistor in response to the node control signal; and
a light-emitting control module, configured to control a driving current to flow through a light-emitting unit in response to the light-emitting control signal.

17. The display panel according to claim 16, wherein the node control module comprises a first transistor and a second transistor;
   a first electrode of the first transistor is electrically connected to a third node, a second electrode of the first transistor is electrically connected to a first electrode of the second transistor, and a second electrode of the second transistor is electrically connected to the gate of the drive transistor; and
   a gate of the first transistor and a gate of the second transistor are both electrically connected to the node control signal terminal.

18. The display panel according to claim 16, wherein:
   the light-emitting control module comprises a third transistor and a fourth transistor; and
   a first electrode of the third transistor is electrically connected to a power signal terminal; a second electrode of the third transistor is electrically connected to a first electrode of the drive transistor; a first electrode of the fourth transistor is electrically connected to a second electrode of the drive transistor; a second electrode of the fourth transistor is electrically connected to the light-emitting unit; and a gate of the third transistor and a gate of the fourth transistor are both electrically connected to the light-emitting control signal terminal.

19. A display apparatus, comprising a display panel, wherein the display comprises:
   a pixel driving circuit comprising a light-emitting control signal terminal and a node control signal terminal; and
   a light-emitting driving circuit comprising a plurality of light-emitting driving units that are cascaded and arranged along a first direction, wherein an output terminal of each of the plurality of light-emitting driving units transmits a light-emitting control signal to the light-emitting control signal terminal;
   a gate driving circuit comprising a plurality of gate driving units that is cascaded and arranged along the first direction, wherein an output terminal of each of the plurality of gate driving units transmits a node control signal to the node control signal terminal; and
   a common transmission signal line,
   wherein at least part of input terminals of the plurality of light-emitting driving units and at least part of input terminals of the plurality of gate driving units are connected to a same common transmission signal line, and
   wherein signals inputted to the at least part of input terminals of the plurality of light-emitting driving units and the at least part of input terminals of the plurality of gate driving units are the same;
   wherein each of the plurality of light-emitting driving units comprises a control module and an output module, a control signal output terminal of the control module of the light-emitting driving unit is electrically connected to the output module of the light-emitting driving unit, and the output module of the light-emitting driving unit is electrically connected to the output terminal of the light-emitting driving unit; and each of the plurality of gate driving units comprises a control module and an output module, a control signal output terminal of the control module of the gate driving units is electrically connected to the output module of the gate driving unit, and the output module of the gate driving unit is electrically connected to the output terminal of the gate driving unit;
   wherein the output module of each of the plurality of light-emitting driving units and the control module of each of the plurality of light-emitting driving units are arranged along a second direction; and the second direction intersects the first direction; and the output module of each of the plurality of gate driving units and the control module of each of the plurality of gate driving units are arranged along the second direction;
   wherein the output module of each of the plurality of light-emitting driving units is located on a side of the control module of each of the plurality of light-emitting driving units that is away from the common transmission signal line; and the output module of each of the plurality of gate driving units is located on a side of the control module of each of the plurality of gate driving units that is away from the common transmission signal line.

* * * * *